(12) United States Patent
Singidi et al.

(10) Patent No.: US 11,854,611 B2
(45) Date of Patent: Dec. 26, 2023

(54) AGGRESSIVE QUICK-PASS MULTIPHASE PROGRAMMING FOR VOLTAGE DISTRIBUTION STATE SEPARATION IN NON-VOLATILE MEMORY

(71) Applicant: SANDISK TECHNOLOGIES LLC, Addison, TX (US)

(72) Inventors: Harish Singidi, Fremont, CA (US); Amiya Banerjee, Karnataka (IN); Shantanu Gupta, Freemont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 187 days.

(21) Appl. No.: 17/326,417

(22) Filed: May 21, 2021

(65) Prior Publication Data

US 2022/0375513 A1  Nov. 24, 2022

(51) Int. Cl.
| | | |
|---|---|---|
| *G11C 11/34* | (2006.01) | |
| *G11C 11/56* | (2006.01) | |
| *G11C 16/04* | (2006.01) | |
| *G11C 16/16* | (2006.01) | |
| *G11C 16/34* | (2006.01) | |
| *G11C 16/10* | (2006.01) | |
| *H10B 41/27* | (2023.01) | |
| *H10B 43/27* | (2023.01) | |

(52) U.S. Cl.
CPC ...... *G11C 11/5628* (2013.01); *G11C 11/5635* (2013.01); *G11C 11/5671* (2013.01); *G11C 16/0483* (2013.01); *G11C 16/10* (2013.01); *G11C 16/16* (2013.01); *G11C 16/3445* (2013.01); *G11C 16/3459* (2013.01); *H10B 41/27* (2023.02); *H10B 43/27* (2023.02)

(58) Field of Classification Search
CPC ............ G11C 11/5628; G11C 11/5635; G11C 11/5671; G11C 16/0483; G11C 16/10; G11C 16/16; G11C 16/3445; G11C 16/225; G11C 16/3459; H10B 41/27; H10B 43/27

See application file for complete search history.

(56) References Cited

U.S. PATENT DOCUMENTS

| 6,061,270 A | * | 5/2000 | Choi | ............ G11C 16/10 365/185.17 |
|---|---|---|---|---|
| 2022/0189570 A1 | * | 6/2022 | Kavalipurapu | ........ G11C 16/30 |
| 2022/0293191 A1 | * | 9/2022 | Singidi | ............... G11C 7/1087 |

* cited by examiner

*Primary Examiner* — Uyen Smet
(74) *Attorney, Agent, or Firm* — Morgan, Lewis & Bockius LLP

(57) ABSTRACT

A multiphase programming scheme for programming a plurality of memory cells of a data storage system includes a first programming phase in which a first set of voltage distributions of the plurality of memory cells is programmed by applying a first plurality of program pulses to word lines of the plurality of memory cells, and a second programming phase in which a second set of voltage distributions is programmed by applying a second plurality of program pulses to the word lines of the plurality of memory cells. The second programming phase includes maintaining a margin of separation between two adjacent voltage distributions of the second set of voltage distributions after each of the second plurality of program pulses. This scheme achieves better margin using an aggressive quick pass approach, which helps with data recovery in case of power loss events.

20 Claims, 22 Drawing Sheets

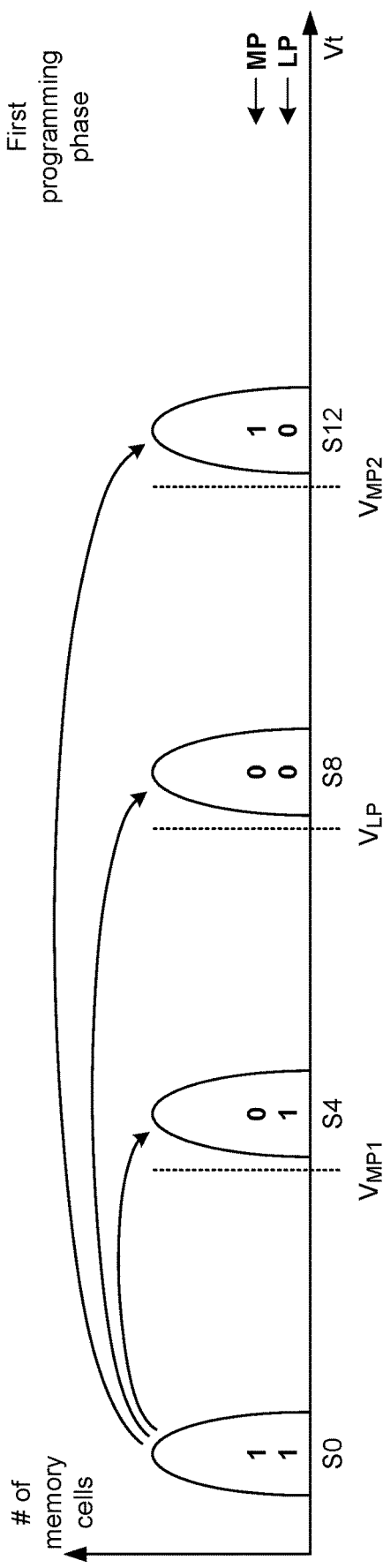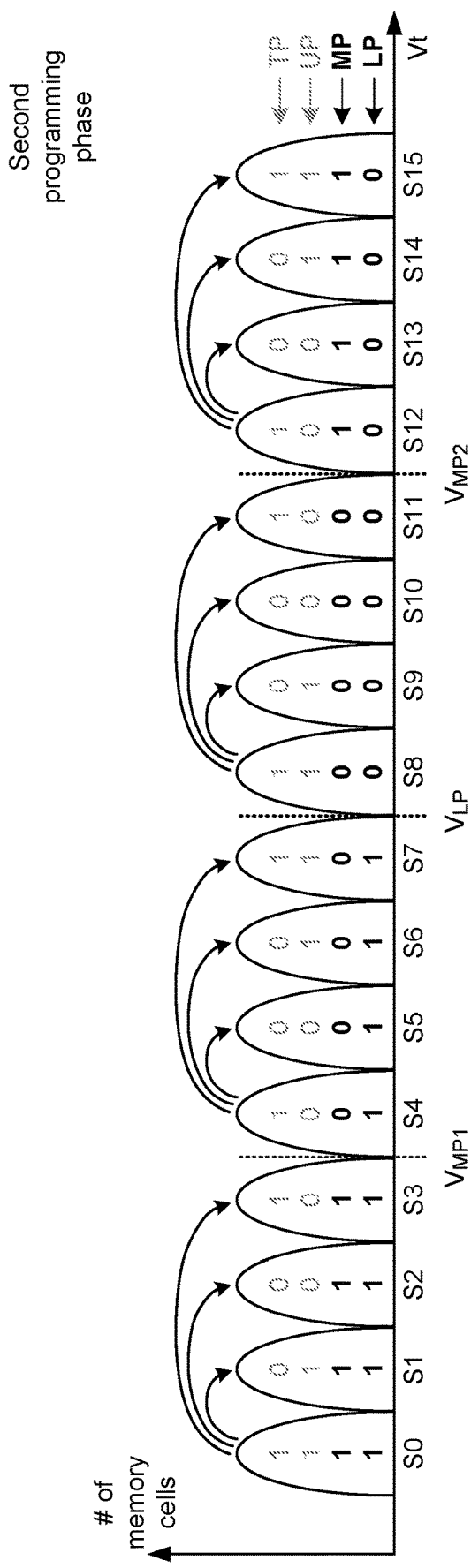

AGGRESSIVE QUICK-PASS MULTIPHASE PROGRAMMING FOR VOLTAGE DISTRIBUTION STATE SEPARATION IN NON-VOLATILE MEMORY

TECHNICAL FIELD

The present description relates in general to data storage systems and methods, and more particularly to, for example, providing programming of multi-level memory cells using an aggressive quick-pass technique to minimize threshold voltage distribution overlap during the programming.

BACKGROUND

The growing demand for high capacity storage devices has catalyzed the use of multi-level not and (NAND) flash memory cells, which include multi-level cells (MLC, 2 bits per cell), triple level cells (TLC, 3 bits per cell), quad level cells (QLC, 4 bits per cell), and higher capacities. As the number of bits stored in a memory cell increases, the level of precision required for reliable data programming also becomes stricter in tandem. Existing approaches for precise programming of multi-level cells may demand additional hardware resources, which increases the complexity and cost of the storage device while reducing available space for other productive uses. Thus, there is a need for a more efficient method of programming multi-level cells.

SUMMARY

Due to hardware and physical limitations among other factors, memory cells are often programmed into a limited voltage range, such as approximately 6.2V. For multi-level cells with a large number of bits per cell, a corresponding large number of distributions needs to be programmed. For example, when including the erased state, QLC memory cells are programmed into 16 distributions corresponding to 16 possible states for storing 4 bits of data within a limited voltage range, such as 6.2V (or less), with a QLC state width of 0.4V (or less). It may not be feasible to precisely program these distributions in a single programming pass.

One approach to provide the required programming precision for multi-level cells is to use a foggy-fine programming approach. For example, when programming QLC memory cells, a first foggy phase may coarsely program 4 bits of data for each memory cell into wide overlapping distributions that are below target voltages, whereas a second fine phase may precisely program the same 4 bits of data for each memory cell to extend into narrower distributions containing the target voltages. However, since the QLC memory cells programmed in the first foggy phase may be unreadable due to the overlapping distributions, read disturb effects, and other factors, the data programmed in the first foggy phase also needs to be stored in an intermediate buffer so that the second fine phase can program the correct voltage difference.

One approach for providing such an intermediate buffer is to reserve high endurance memory, such as single level cells (SLC), as a cache for storing the foggy phase data. Using non-volatile memory can provide resilience against power failures to maintain data integrity, and may be more cost effective than using volatile random access memory. However, since SLC provides lower storage density and requires higher cost compared to multi-level memory cells, using SLC still increases the overall cost of the storage device and reduces available device space for other productive uses such as storing user data and overprovisioning. Accordingly, the capacity, endurance, performance, and cost effectiveness of the storage device may be limited when using a foggy-fine programming approach.

As an alternative to foggy-fine programming, MLC can be programmed in the first pass (also referred to herein as a first, initial, or intermediate phase), then extended to QLC in the second pass (also referred to herein as a second, final, or target phase). Specifically, in an example for programming QLC memory cells, a first phase programs the memory cells in a MLC mode. The target programming distributions in the first phase may be configured such that the memory cells are readable after programming, and may be adjusted to target specific desirable characteristics. For example, narrow target distributions may enable reduced or no error correction when reading, whereas wider target distributions may enable faster programming during the first phase.

As the memory cells are readable after the first phase, the second phase can read the programmed data directly from the memory cells in preparation for programming the memory cells in a QLC mode. By using the selected multiphase mapping, the correct voltage difference can be determined to program the memory cells from their MLC states into their final QLC states. As a result, this approach enables the omission of a buffer or cache to store the data programmed during the first phase, which helps to simplify storage device design and frees device space for other productive uses such as storing user data or overprovisioning.

One or more implementations of the subject technology provide several performance benefits that improve the functionality of a computer. As discussed above, a foggy-fine programming approach requires a buffer or cache to be reserved on the device, which in turn reduces space available for other productive purposes. Since the described multiphase programming procedure can read back the data directly from the programmed memory cells, the buffer or cache can be omitted, thereby reclaiming device space for user data, overprovisioning, or other purposes. High endurance non-volatile memory suitable for the cache, such as SLC memory cells, can be expensive, and thus the omission of the cache may help to improve the cost effectiveness of the storage device. Additionally, by using the reclaimed device space for user data, overprovisioning, or other purposes, various performance metrics of the storage device can be improved, such as write endurance, read/write bandwidth, read/write latency, and/or storage capacity. In turn, a host computer coupled to the storage device also receives the benefits of the storage device's improved performance.

One drawback to the MLC to QLC multiphase programming technique described above includes overlap in the memory cell voltage distributions during the second programming. Such overlap may lead to unrecoverable data in the event of power loss. Hence, this application describes an aggressive quick-pass programming scheme that separates the voltage distribution states of the memory cells during the second programming pass of a multiphase programming scheme. This scheme protects lower page and/or middle page data in the event of a power loss without requiring caching of the data.

In one aspect, a data storage system comprises a storage medium including a plurality of memory cells, and control circuitry coupled to the storage medium. The control circuitry is configured to program the plurality of memory cells using a multiphase programming scheme including a first programming phase and a second programming phase.

In some implementations, the first programming phase includes programming a first set of voltage distributions (e.g., four MLC states) of the plurality of memory cells by applying a first plurality of program pulses to word lines of the plurality of memory cells.

In some implementations, the second programming phase includes programming a second set of voltage distributions (e.g., sixteen QLC states) by applying a second plurality of program pulses to the word lines of the plurality of memory cells, wherein the second set of voltage distributions includes more voltage distributions than the first set of voltage distributions. The second programming phase includes maintaining a margin of separation between two adjacent voltage distributions of the second set of voltage distributions after each of the second plurality of program pulses.

In some implementations, a first voltage distribution of the two adjacent voltage distributions has a first width; a second voltage distribution of the two adjacent voltage distributions has a second width; and maintaining the margin of separation between the two adjacent voltage distributions includes decreasing the first width compared to the second width.

In some implementations, decreasing the first width compared to the second width includes partially inhibiting subsequent program pulses for a portion of memory cells in the first voltage distribution having threshold voltages higher than an inhibiting threshold.

In some implementations, the first voltage distribution is characterized by a first program verify target corresponding to a minimum threshold voltage for memory cells associated with the first voltage distribution; the second voltage distribution is characterized by a second program verify target corresponding to a minimum threshold voltage for memory cells associated with the second voltage distribution; and the inhibiting threshold is higher than the first program verify target and lower than the second program verify target.

In some implementations, partially inhibiting subsequent program pulses of the portion of memory cells in the first voltage distribution includes applying an inhibiting voltage signal to bit lines associated with the portion of memory cells.

In some implementations, the plurality of memory cells are configured to be completely inhibited from being programmed upon assertion of a supply voltage of the data storage system; and the inhibiting voltage signal is greater than 0V and less than the supply voltage.

In some implementations, a read reference voltage for lower page or middle page data associated with one or more of the second set of voltage distributions is in the margin of separation between the two adjacent voltage distributions.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 11A-11B illustrate examples of program distributions after a first programming phase in MLC mode and a second programming phase in QLC mode using a multiphase mapping in accordance with some implementations.

Figure 1:
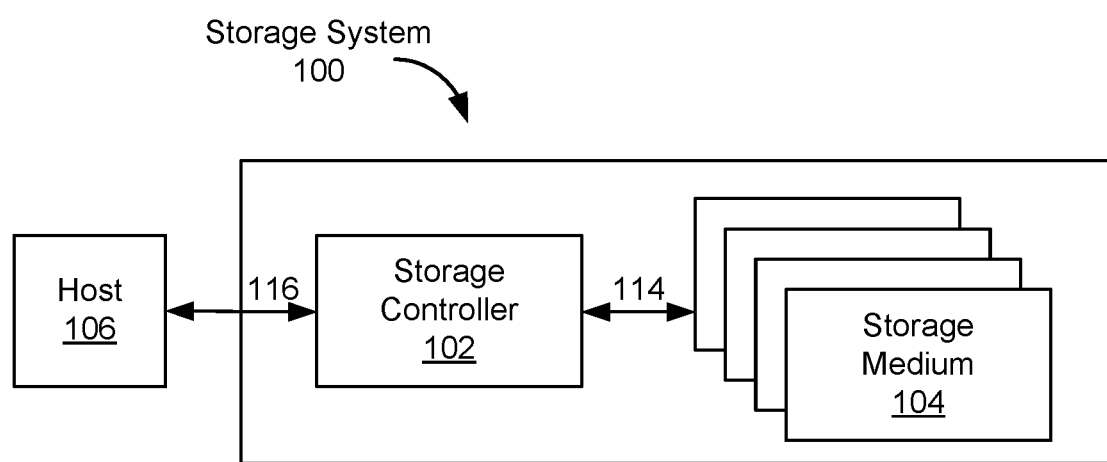
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
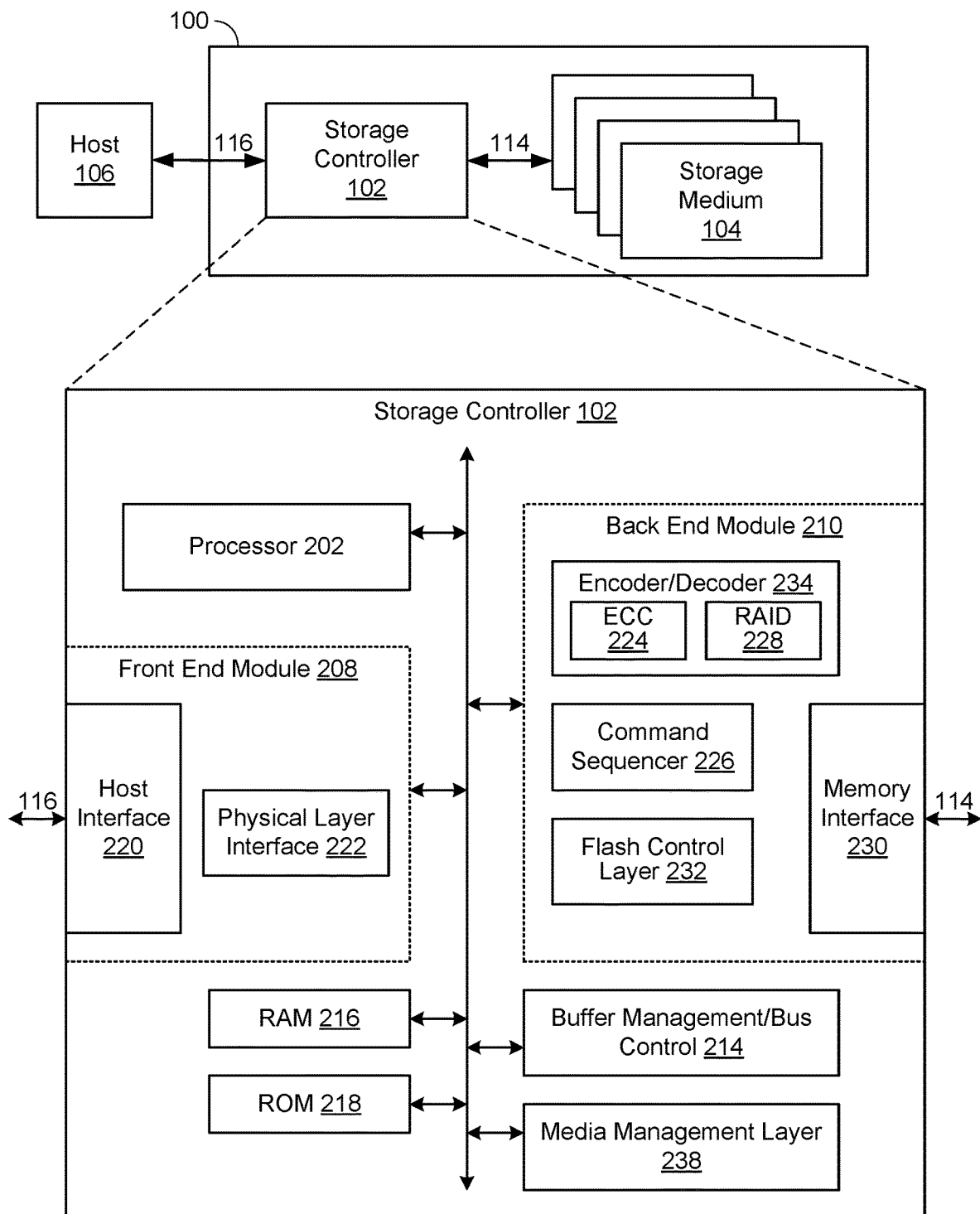
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro)processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
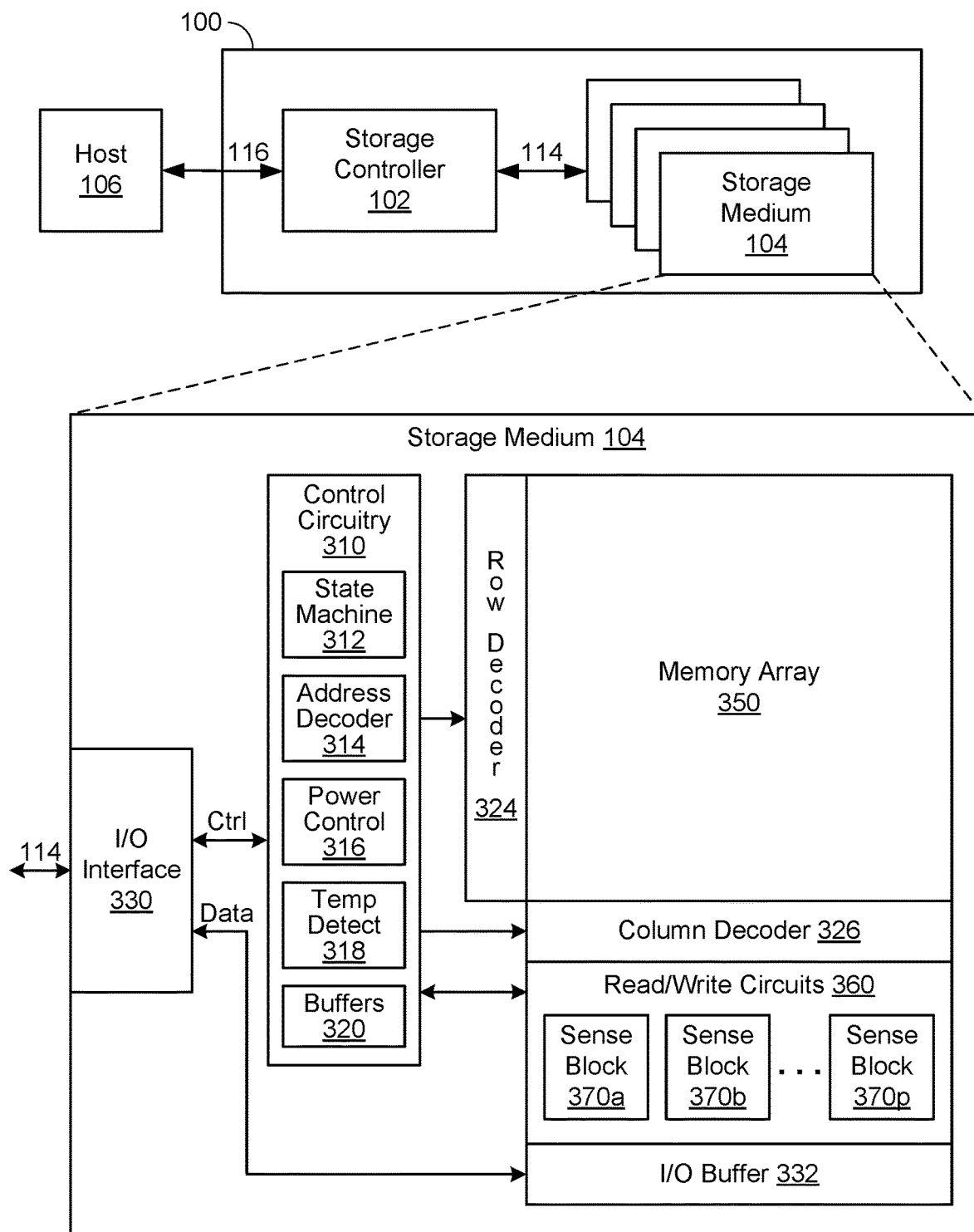
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4A:
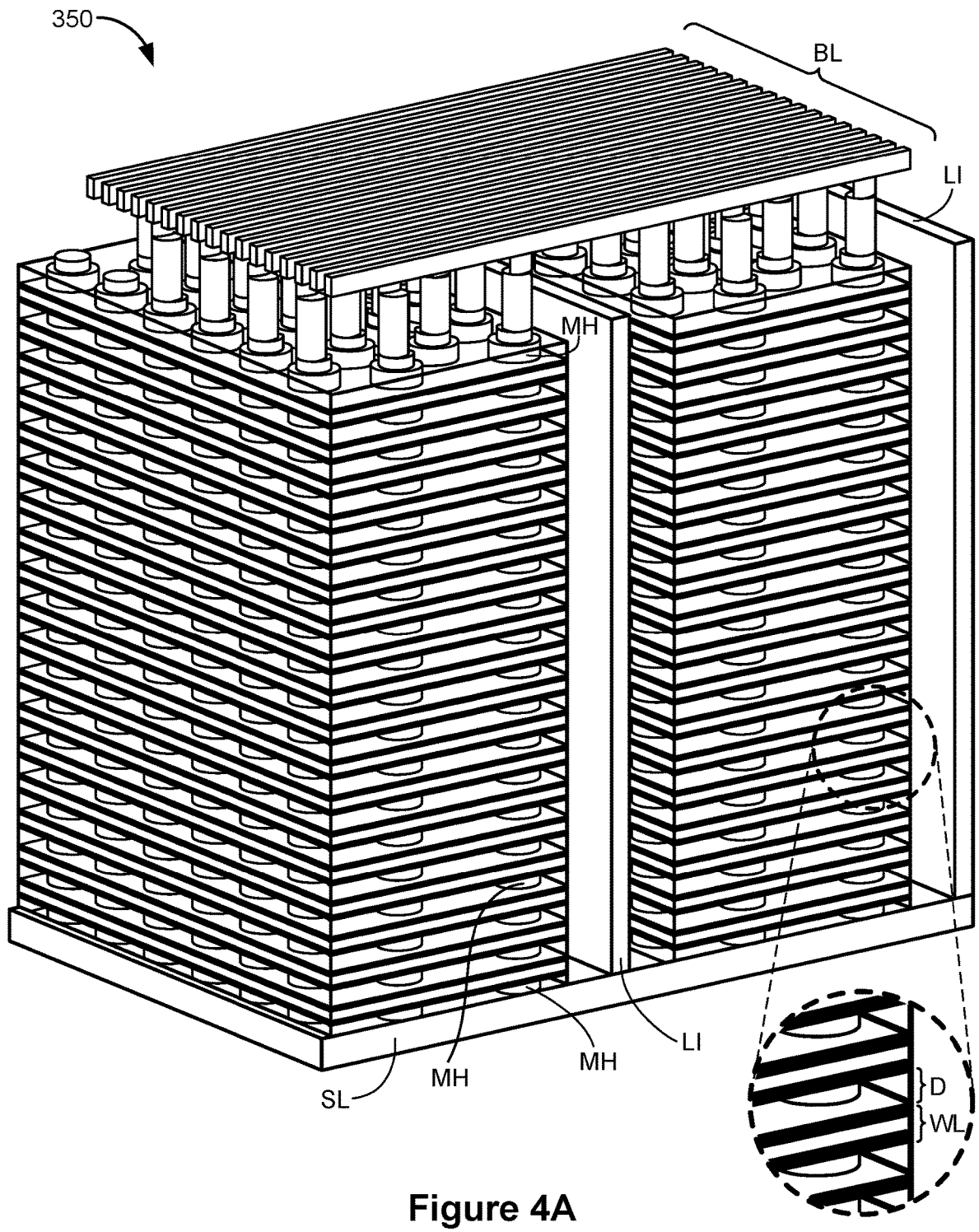
FIG. 4A is a perspective view of a portion of one implementation of a three-dimensional monolithic memory array in accordance with some implementations.

FIG. 4A is a perspective view of a portion of an example implementation of a monolithic three dimensional memory array that may comprise memory array 350, which includes a plurality of non-volatile memory cells. For example, FIG. 4A shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as WL.

The number of alternating dielectric layers and conductive layers can vary based on specific implementation requirements. One set of implementations includes between 104-216 alternating dielectric layers and conductive layers. One example implementations includes 96 data word line layers, 8 select layers, 6 dummy word line layers and 110 dielectric layers. More or less than 104-216 layers can also be used. As will be explained below, the alternating dielectric layers and conductive layers may be divided into four "fingers" or sub-blocks by local interconnects LI. FIG. 4A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4A, the dielectric layers are depicted as see-through so that the reader can see the memory holes positioned in the stack of alternating dielectric layers and conductive layers. In some implementations, NAND strings are formed by filling the vertical column/memory hole with materials including a charge-trapping material to create a vertical column of memory cells. Each memory cell can store one or more bits of data. More details of the three dimensional monolithic memory array that comprises memory array 350 is provided below with reference to FIG. 4B-4F.

Figure 4B:
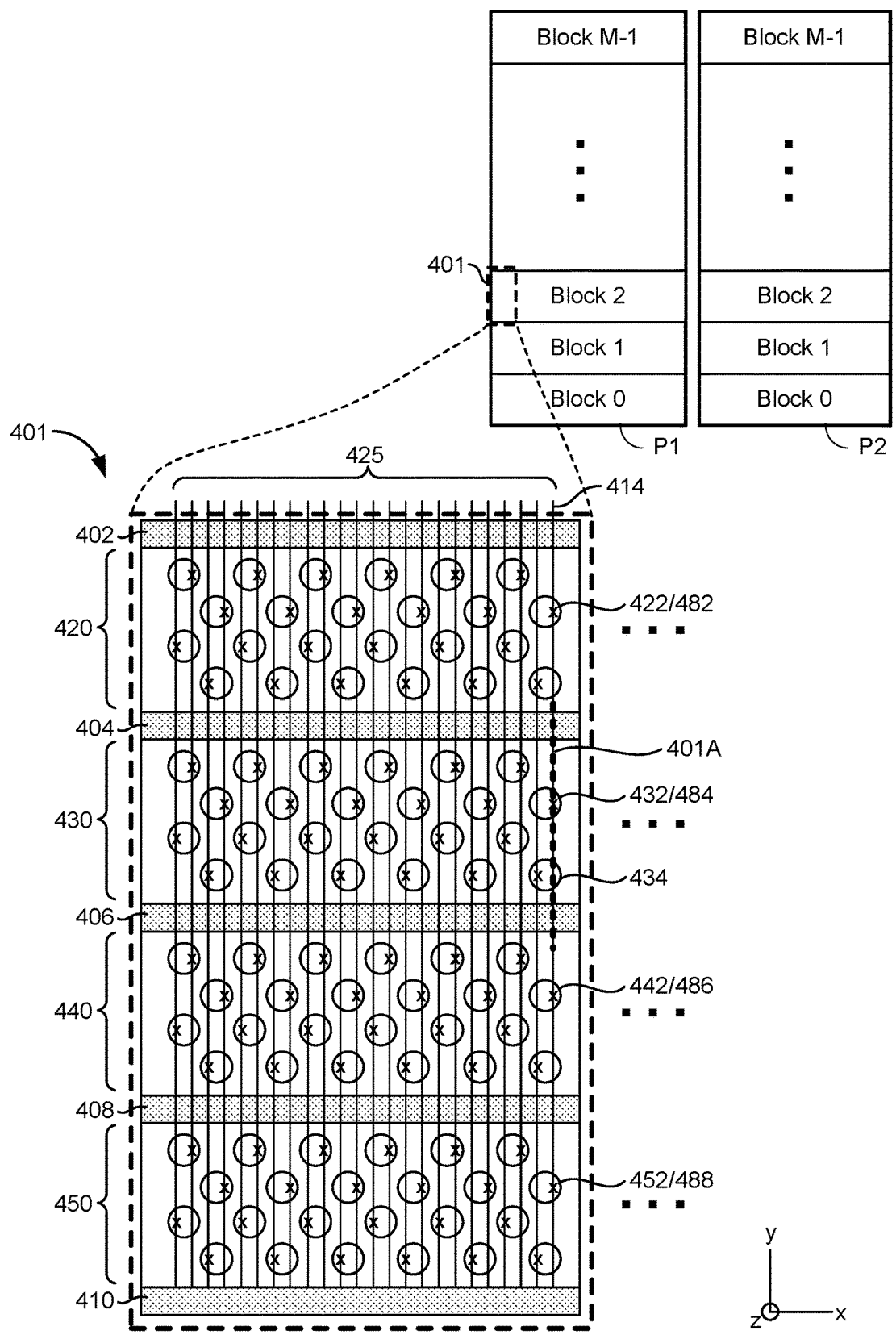
FIG. 4B is a block diagram of a memory array having two planes, and a top view of a portion of a block of memory cells in accordance with some implementations.

FIG. 4B depicts an example three dimensional (3D) NAND structure that corresponds to the structure of FIG. 4A and can be used to implement memory array 350 of FIG. 3. The memory array 350 may be divided into two planes P1 and P2. Each plane may be divided into M blocks. In one example, each plane has about 2000 blocks. However, different numbers of blocks and planes can also be used. In some implementations, a block of memory cells is a unit of erase. That is, all memory cells of a block are erased together.

In some implementations, memory cells can be grouped into blocks for other reasons, such as to organize the memory array 350 to enable the signaling and selection circuits. In some implementations, a block represents a groups of connected memory cells as the memory cells of a block share a common set of unbroken word lines and unbroken bit lines. Block 0 and block M-1 of both planes P1 and P2 may be referred to as being located in an edge region/section of the memory array 350.

FIG. 4B further includes a detailed top view of a portion 401 of one block from the memory array 350. The block depicted in portion 401 extends in the x direction. In some implementations, the memory array 350 has many layers; however, FIG. 4B only shows the top layer.

FIG. 4B depicts a plurality of circles that represent the vertical columns MH. Each of the vertical columns include multiple select transistors (also referred to as a select gate or selection gate) and multiple memory cells. In some implementations, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the x direction, the block includes more vertical columns than depicted in FIG. 4B.

FIG. 4B also depicts a set of bit lines 425, including bit line 414. FIG. 4B shows twenty four bit lines because only a portion of the block is depicted. More than twenty four bit lines may be connected to vertical columns of the block. Each of the circles representing vertical columns has an "x" to indicate its connection to one bit line. For example, bit line 414 is connected to vertical columns 422, 432, 442 and 452 (but not vertical column 434). In some implementations, bit lines are positioned over the memory array 350 and run along the entire length of the plane (e.g., from the top of plane P1 to the bottom of plane P1).

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions. For example, the top layer depicted in FIG. 4B is divided into regions 420, 430, 440, and 450, which are referred to as fingers or sub-blocks. In the layers of the block that implement memory cells, the four regions are referred to as word line fingers that are separated by the local interconnects.

In some implementations, the word line fingers on a common level of a block connect together to form a single word line. In some implementations, the word line fingers on the same level are not connected together. In one example implementation, a bit line only connects to one vertical column in each of regions 420, 430, 440 and 450. For such an implementation, each block has sixteen rows of active columns and each bit line connects to four rows in each block. In some implementations, all of four rows connected to a common bit line are connected to the same word line (via different word line fingers on the same level that are connected together). Therefore, the address decoders use the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other implementations may include more or less regions per block, more or less rows of vertical columns per region and more or less rows of vertical columns per block. FIG. 4B also shows the vertical columns being staggered. In other implementations, different patterns of staggering can be used. In some implementations, the vertical columns are not staggered.

Figure 4C:
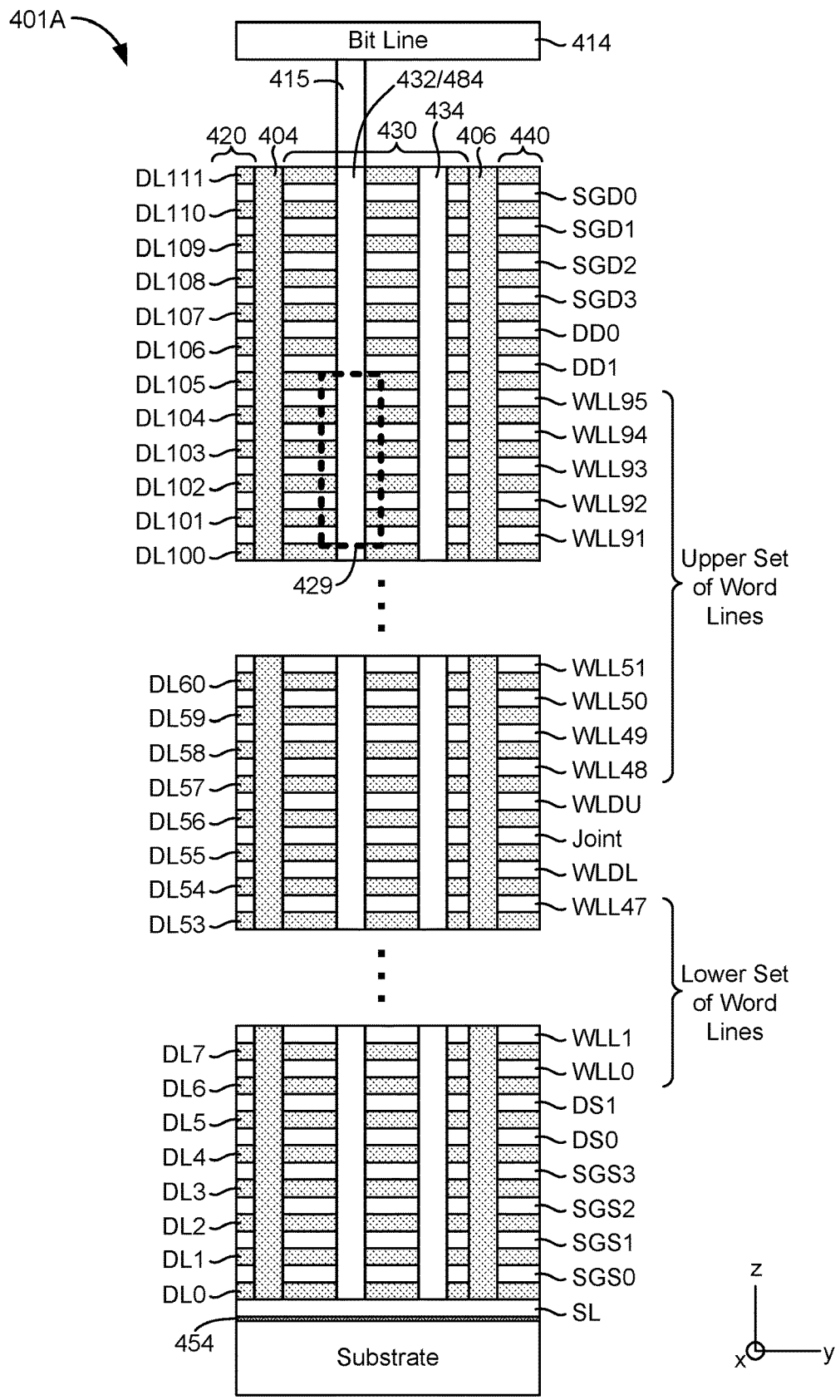
FIG. 4C depicts a cross sectional view of a portion of a block of memory cells in accordance with some implementations.

FIG. 4C depicts a portion of some implementations of the three dimensional memory array 350 showing a cross-sectional view along line 401A of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety-six data word line layers WLL0-WLL95 for connecting to data memory cells. Other implementations can implement more or less than four drain side select layers, more or less than four source side select layers, more or less than six dummy word line layers, and more or less than ninety six word lines.

Vertical columns 432 and 434 are depicted protruding through the drain side select layers, source side select layers, dummy word line layers and word line layers. In some implementations, each vertical column comprises a vertical NAND string. For example, vertical column 432 comprises NAND string 484. Below the vertical columns and the layers listed below is the substrate, an insulating film 454 on the substrate, and the source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In some implementations, the conductive layers are made from a combination of TiN and Tungsten. In other implementations, other materials can be used to form the conductive layers, such as doped polysilicon, metal such as Tungsten or metal silicide. In some implementations, different conductive layers can be formed from different materials. Between conductive layers are dielectric layers DL0-DL111. For example, dielectric layer DL104 is above word line layer WLL94 and below word line layer WLL95. In some implementations, the dielectric layers are made from SiO2. In other implementations, other dielectric materials can be used to form the dielectric layers.

The non-volatile memory cells are formed along vertical columns which extend through alternating conductive and dielectric layers in the stack. In some implementations, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host 106, such as data from a user of the host 106), while a data memory cell is eligible to store host data. In some implementations, data memory cells and dummy memory cells may have the same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In some implementations it is expensive and/or challenging to etch ninety six word line layers intermixed with dielectric layers. To ease this burden, some implementations include laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect the first stack to the second stack. In FIG. 4C, the first stack is labeled as the "Lower Set of Word Lines" and the second stack is labeled as the "Upper Set of Word Lines." In some implementations, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
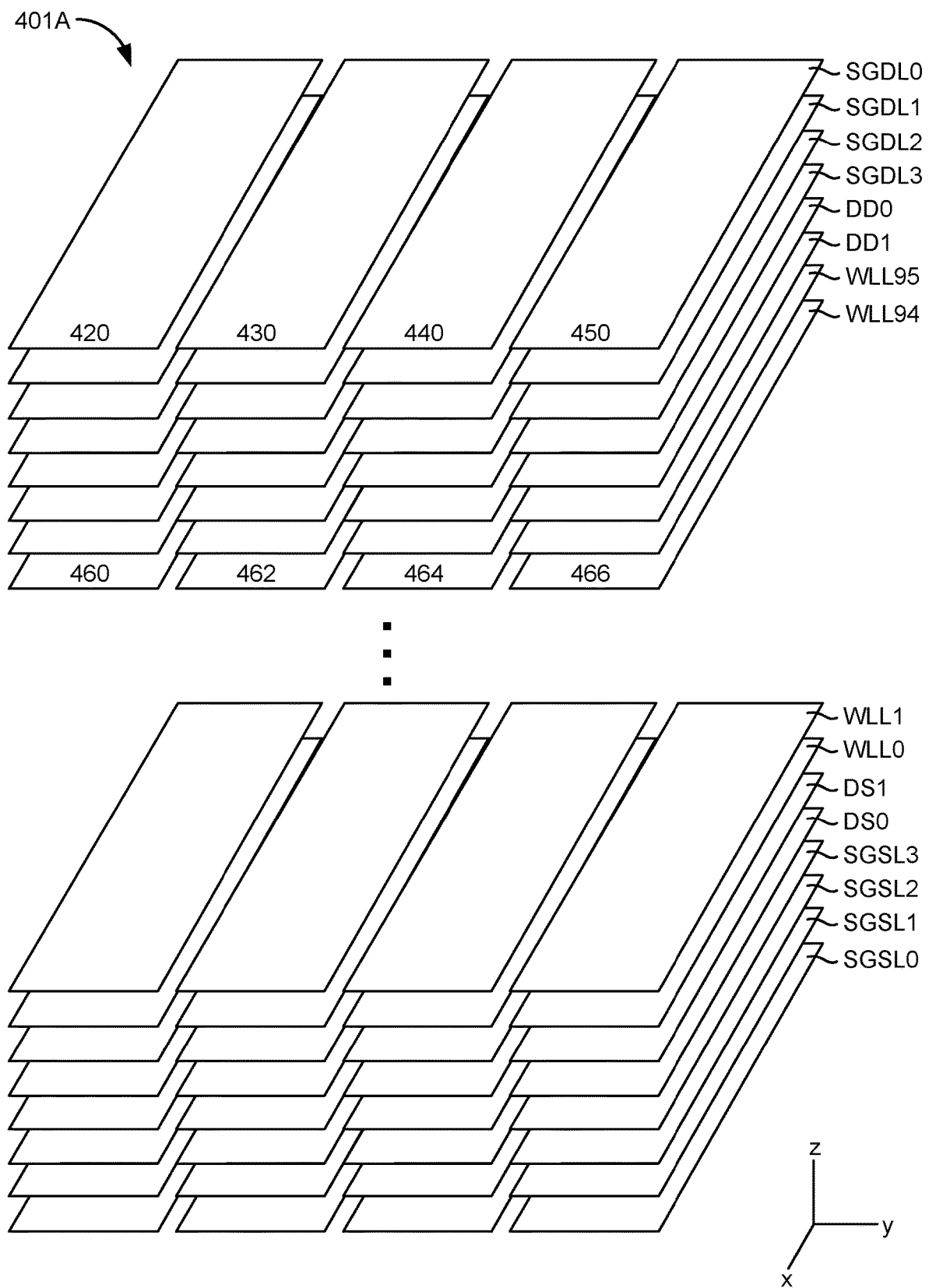
FIG. 4D depicts a view of the select gate layers and word line layers in accordance with some implementations.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with reference to FIG. 4B, in some implementations local interconnects 402, 404, 406, 408, and 410 break up the conductive layers into four regions/fingers (or sub-blocks). For example, word line layer WLL94 is divided into regions 460, 462, 464, and 466. For the word line layers (WLL0-WLL95), the regions are referred to as word line fingers. For example, word line layer WLL94 is divided into word line fingers 460, 462, 464, and 466. For example, region 460 is one word line finger on one word line layer. In some implementations, each word line finger on the same level is connected together. In some implementations, each word line finger operates as a separate word line.

Drain side select gate layer SGD0 (the top layer) is also divided into regions 420, 430, 440, and 450, also known as fingers or select line fingers. In some implementations, each select line finger on the same level is connected together. In some implementations, each select line finger operates as a separate word line.

Figure 4E:
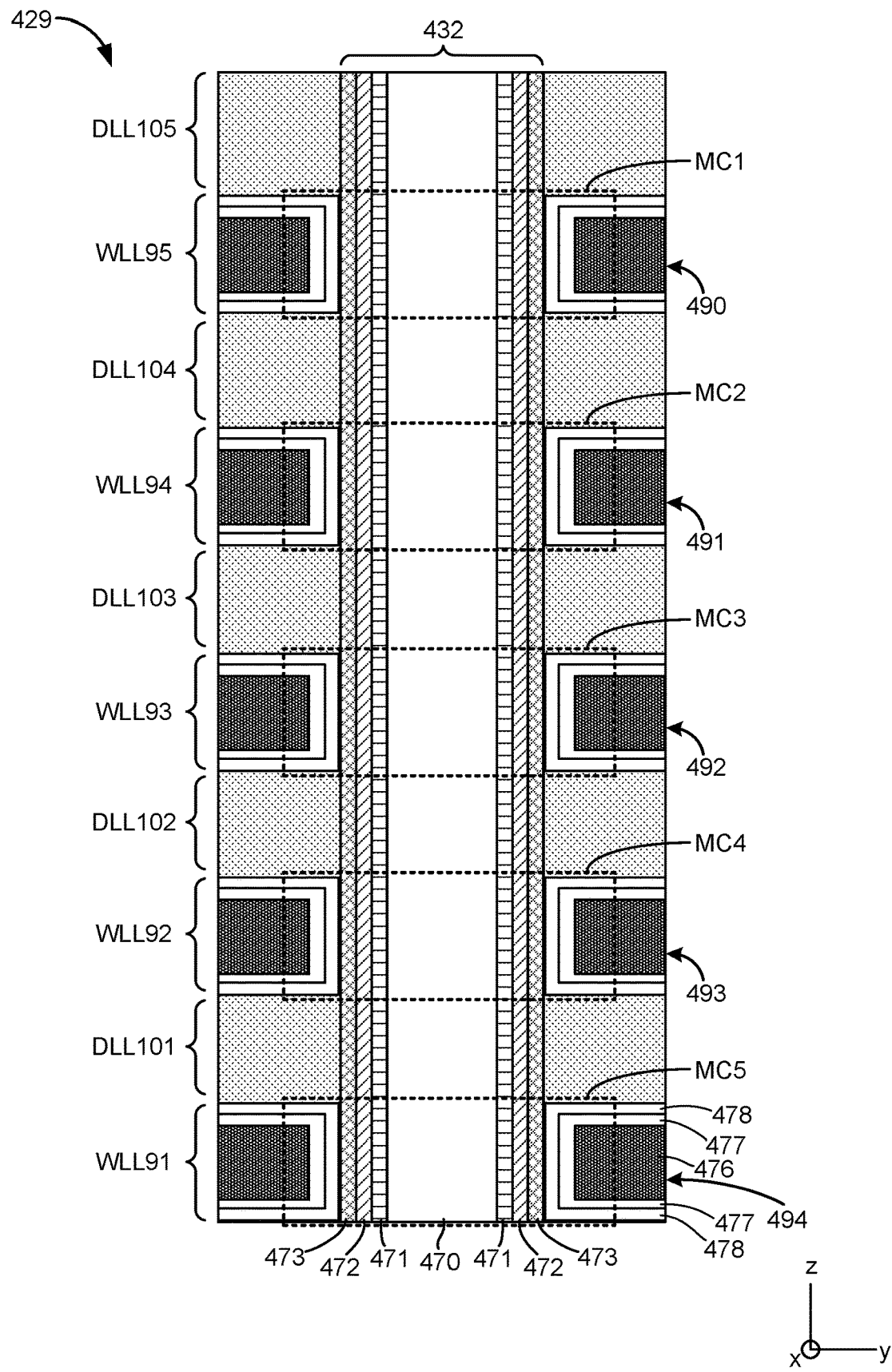
FIG. 4E is a cross sectional view of a vertical column of memory cells in accordance with some implementations.

FIG. 4E depicts a cross sectional view of region 429 of FIG. 4C that includes a portion of vertical column 432 (a memory hole) that extends through the alternating conductive layers and dielectric layers. In some implementations, the vertical columns are round; however, in other implementations other shapes can be used. In some implementations, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In some implementations, tunneling dielectric 472 has an ONO structure. Surrounding tunneling dielectric 472 is charge trapping layer 473, such as (for example) silicon nitride. Other memory materials and structures can also be used. The technology described herein is not limited to any particular material or structure.

FIG. 4E depicts dielectric layers DLL105, DLL104, DLL103, DLL102, and DLL101, as well as word line layers WLL95, WLL94, WLL93, WLL92, and WLL91. Each of the word line layers includes a word line region 476 surrounded by an aluminum oxide layer 477, which is surrounded by a blocking oxide (e.g., SiO2) layer 478. The physical interaction of the word line layers with the vertical column forms the memory cells. Thus, a memory cell, in some implementations, comprises channel 471, tunneling dielectric 472, charge trapping layer 473, blocking oxide layer 478, aluminum oxide layer 477 and word line region 476.

For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In some implementations, the programming is achieved through Fowler-Nordheim (FN) tunneling of the electrons into the charge trapping layer. During an erase operation, the electrons return to the channel or holes are injected into the charge trapping layer to recombine with electrons. In some implementations, erasing is achieved using hole injection into the charge trapping layer via a physical mechanism such as gate induced drain leakage (GIDL).

Figure 4F:
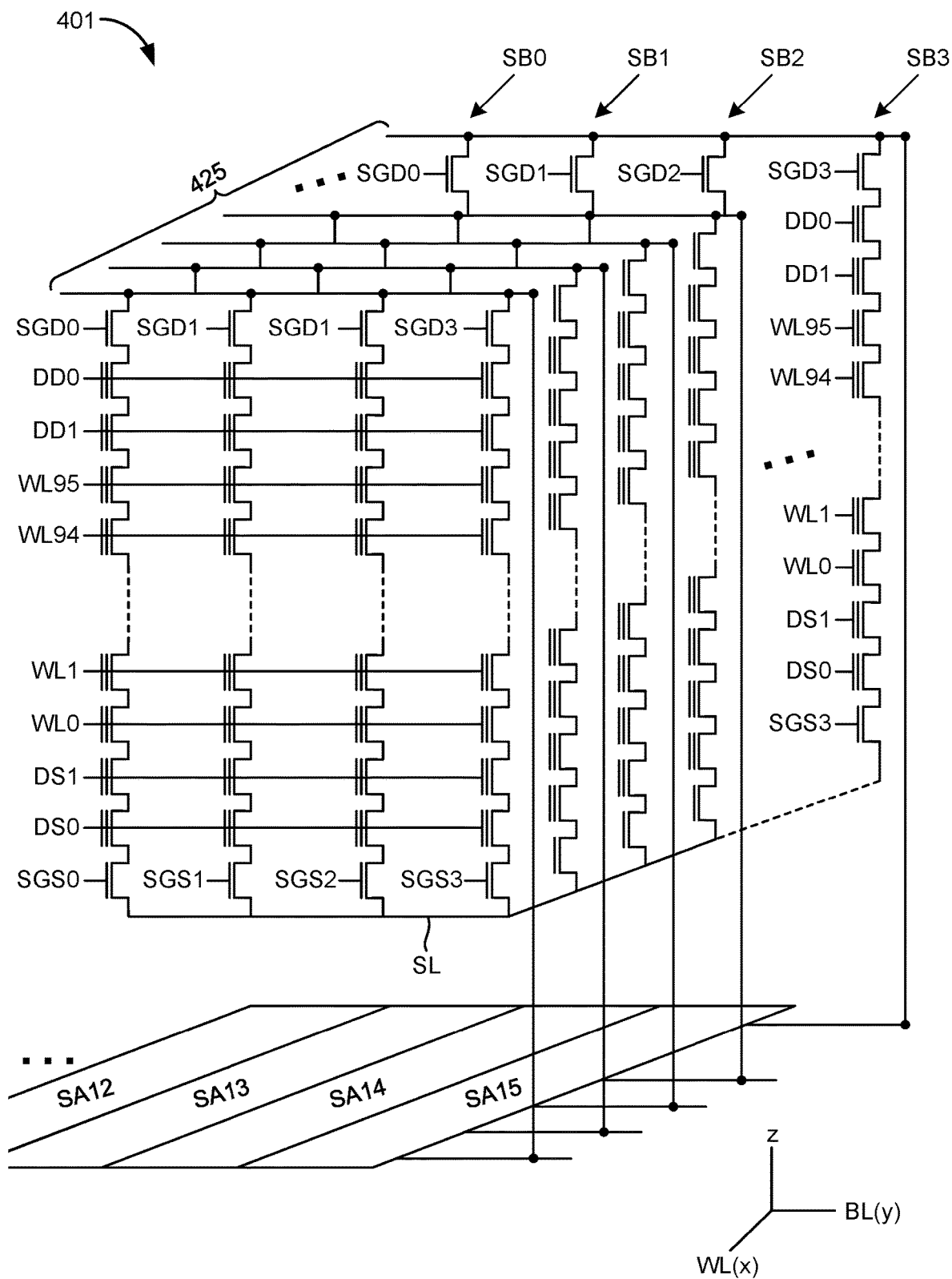
FIG. 4F is a schematic of a plurality of NAND strings in accordance with some implementations.

FIG. 4F is a schematic diagram of a portion of the memory array 350 depicted in FIGS. 4A-4E. FIG. 4A shows physical word lines WLL0-WLL95 running across the entire block. The structure of FIG. 4F corresponds to portion 401 in Block 2 of FIGS. 4B-4E including bit lines 425. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5A:
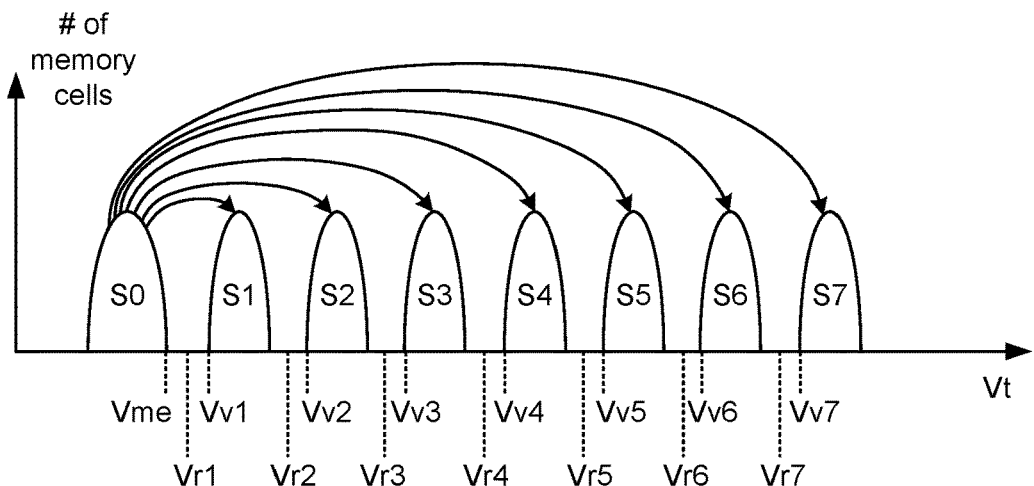
FIG. 5A illustrates example threshold voltage distributions (ranges) for TLC memory cells that store three bits of data in accordance with some implementations.

FIG. 5A illustrates example threshold voltage distributions (ranges) for TLC memory cells that store three bits of data. Other implementations, however, may use other data capacities per memory cell (e.g., such as one, two, four, five, or more bits of data per memory cell). FIG. 5A shows eight threshold voltage distributions, corresponding to eight data states. The first threshold voltage distribution (data state) S0 represents memory cells that are erased. The system uses an erase verify reference voltage Vme to test whether the memory cells are sufficiently erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In some implementations, data values are assigned to the threshold voltage ranges using a Gray code assignment so that if the threshold voltage of a memory erroneously shifts to its neighboring data state, only one bit is affected.

FIG. 5A also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5A also shows seven verify reference voltages (also referred to as program verify targets) Vv1, Vv2, Vv3, Vv4, Vv5, Vv6, and Vv7. When programming memory cells to data state S1, the system tests whether those memory cells have a threshold voltage greater than or equal to Vv1. When programming memory cells to data state S2, the system tests whether the memory cells have threshold voltages greater than or equal to Vv2. When programming memory cells to data state S3, the system determines whether memory cells have their threshold voltage greater than or equal to Vv3. When programming memory cells to data state S4, the system tests whether those memory cells have a threshold voltage greater than or equal to Vv4. When programming memory cells to data state S5, the system tests whether those memory cells have a threshold voltage greater than or equal to Vv5. When programming memory cells to data state S6, the system tests whether those memory cells have a threshold voltage greater than or equal to Vv6. When programming memory cells to data state S7, the system tests whether those memory cells have a threshold voltage greater than or equal to Vv7. Example voltages for FIG. 5A are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v.

In some implementations, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5A represent the full sequence programming. The technology described herein can also be used with other types of programming in addition to full sequence programming (including, but not limited to, multiple stage/phase programming). In some implementations, data states S1-S7 can overlap, with controller 102 relying on an ECC algorithm to identify the correct data.

Figure 5B:
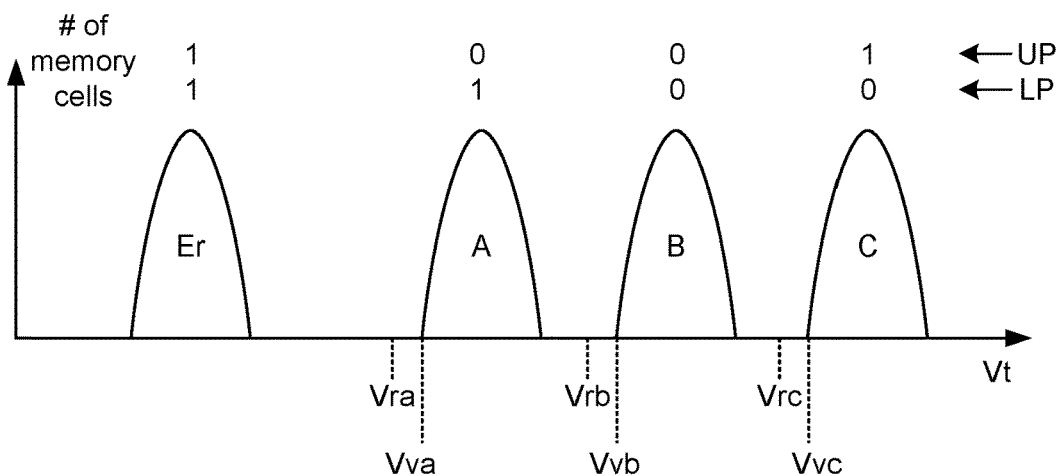
FIG. 5B illustrates example threshold voltage distributions (ranges) for MLC memory cells that store two bits of data in accordance with some implementations.

FIG. 5B illustrates example threshold voltage distributions (ranges) for MLC memory cells that store two bits of data in accordance with some implementations. A first threshold voltage (Vth) distribution corresponding to state Er is provided for erased memory cells. Three Vth distributions corresponding to states A, B, and C represent three programmed states. In some implementations, the threshold voltages in state Er and the threshold voltages in the A, B and C distributions are positive. In some implementations, the threshold voltage distribution for state Er is negative, while the threshold voltage distributions for the A-state, B-state and C-state distributions are positive.

Three read reference voltages, Vra, Vrb and Vrc, are also provided for reading data from memory cells. By testing whether the threshold voltage of a given memory cell is above or below Vra, Vrb and Vrc, the system can determine the state, e.g., programming condition, the memory cell is in.

Further, three verify reference voltages, Vva, Vvb and Vvc, are provided. When programming memory cells to the A-state, B-state or C-state, the system tests whether those memory cells have a threshold voltage greater than or equal to Vva, Vvb or Vvc, respectively.

In the example of FIG. 5B, a multi-state memory cell stores data for two different pages: a lower page (LP) and an upper page (UP). Four states are depicted by the threshold voltage distributions Er, A, B, and C. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

Figure 5C:
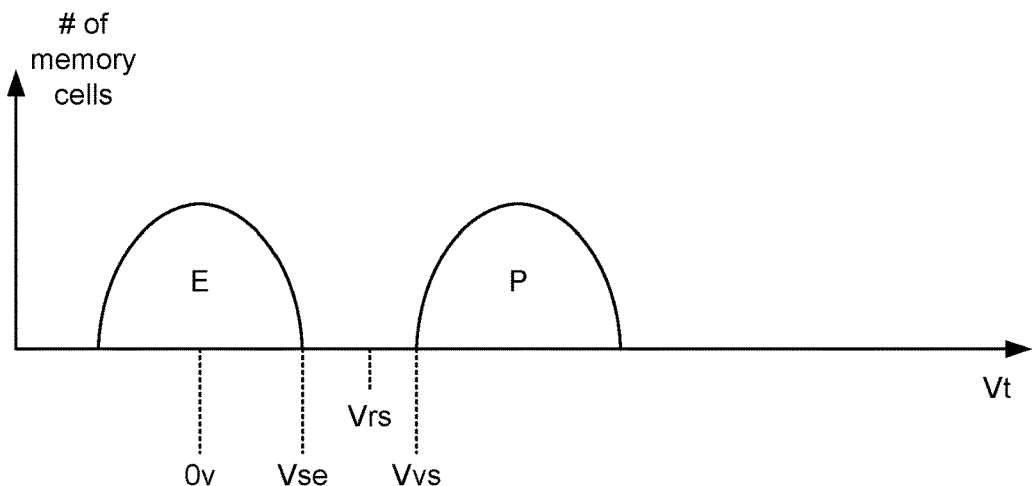
FIG. 5C illustrates example threshold voltage distributions (ranges) for SLC memory cells that store one bit of data in accordance with some implementations.

FIG. 5C illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P.

FIG. 5C also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs. Example voltages for FIG. 5C are Vse=Vr2=1 v, Vrs=1.2 v and Vvs=2.4 v.

Figure 6:
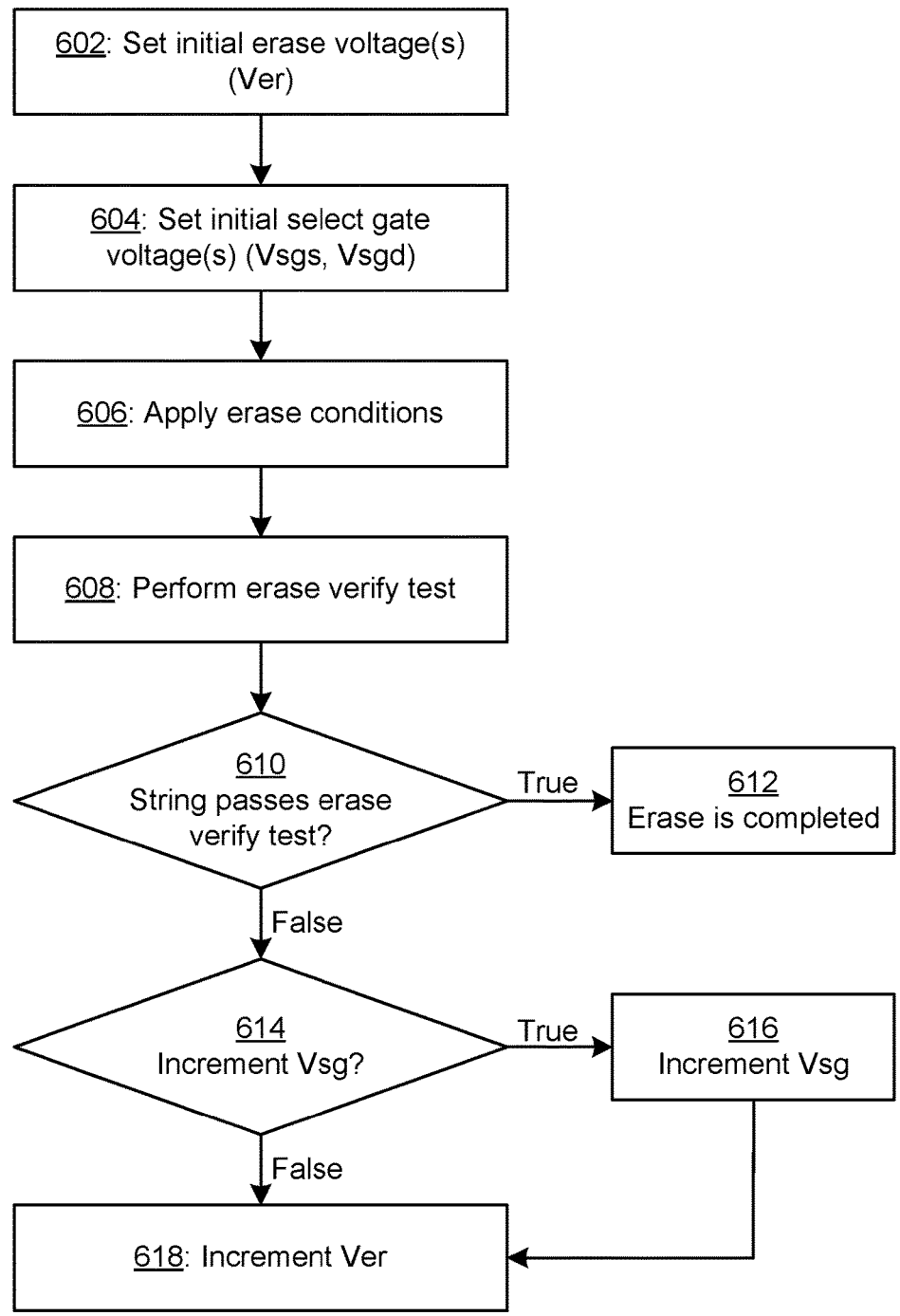
FIG. 6 is a flowchart depicting a process for performing erase operations on a plurality of memory cells in accordance with some implementations.

FIG. 6 is a flowchart depicting a process 600 for performing erase operations on a plurality of memory cells in accordance with some implementations. The process 600 is described with respect to a NAND string of non-volatile memory cells. The NAND string includes a select transistor on each end of the NAND string. For example, a first select transistor may be a drain side select transistor, which has one of its terminals (e.g., drain) coupled to a bit line. A second select transistor may be a source side select transistor, which has one of its terminals coupled to a source line. The process 600 may be performed in parallel on many NAND strings. Therefore, the process 600 may be used to erase a set of word lines. The process 600 may be used to erase a NAND string such as depicted in FIGS. 4A-4F. In some implementations, only the portion of a NAND string that is within a selected tier (e.g., upper tier 510 or lower tier 508) is erased as a unit.

Operation 602 sets a magnitude of an initial steady state erase voltage (Ver). In some implementations, the process 600 performs a two-sided GIDL erase. The erase voltage pulse is to be applied to the bit line and to the source line. In some implementations, the steady state magnitude of the erase voltage pulse is different for the bit line and the source line. In some implementations, the magnitude of the steady state erase voltage is the same for the bit line and the source line. Operation 602 refers to the voltage that is applied to the end of the bit line and the source line that is not adjacent to the select transistors.

Operation 604 sets a magnitude of an initial select gate voltage (Vsg). Herein, Vsg may be referred to as an erase voltage, as it helps to establish a GIDL voltage between two terminals of a select transistor. A select gate voltage (Vsgd) pulse is provided to the drain side select line (e.g., SGD) that is connected to a control gate of a drain side select transistor. A select gate voltage (Vsgs) pulse is provided to the source side select line (e.g., SGS) that is connected to a control gate of a source side select transistor. The magnitudes of Vsgd and Vsgs may be the same as each other or different from each other.

Operation 606 includes applying erase conditions. Operation 606 may include applying voltage pulses to a bit line, a source line, a select line connected to a drain side select transistor, a select line connected to a source side select transistor, and word lines connected to control gates of memory cells. The same magnitude or different magnitude erase voltages may be applied to the bit line and the source line. In some implementations, the drain select line and the source select line are left floating. Erase enable voltages may be applied to the word lines. Operation 606 may include controlling the timing of the various signals.

Operation 606 may include charging up (e.g., increasing the voltage of) a channel of the memory string from both the source and the drain end, and setting a low voltage such as 0 V on the word lines connected to the control gates of the memory cells. In some implementations, charging up the channels includes applying a suitable voltage to the drain side and/or the source side select gates to generate GIDL current.

Operation 608 includes performing an erase verify test for a NAND string. Typically, this involves setting an erase verify voltage (e.g., Vme) to the word lines that are connected to control gates of memory cells on the string while sensing a current in the memory string. If the current is sufficiently high, the NAND string is considered to pass the verify test. If the NAND string passes the erase verify test at decision operation 610, the erase operation is completed, at operation 612. If the NAND string does not pass the erase verify test at decision operation 610, the process continues at operation 614.

Operation 614 includes a determination of whether the select gate voltage is to be incremented. If so, then the select gate voltage is incremented in operation 616. Whether or not the select gate voltage is incremented, the erase voltage is incremented in operation 618. Then, the next iteration of the erase procedure is performed by returning to operation 606. An erase iteration (or loop) typically involves applying erase conditions followed by performing a verify test, although in some cases the verify test is omitted.

Figure 7:
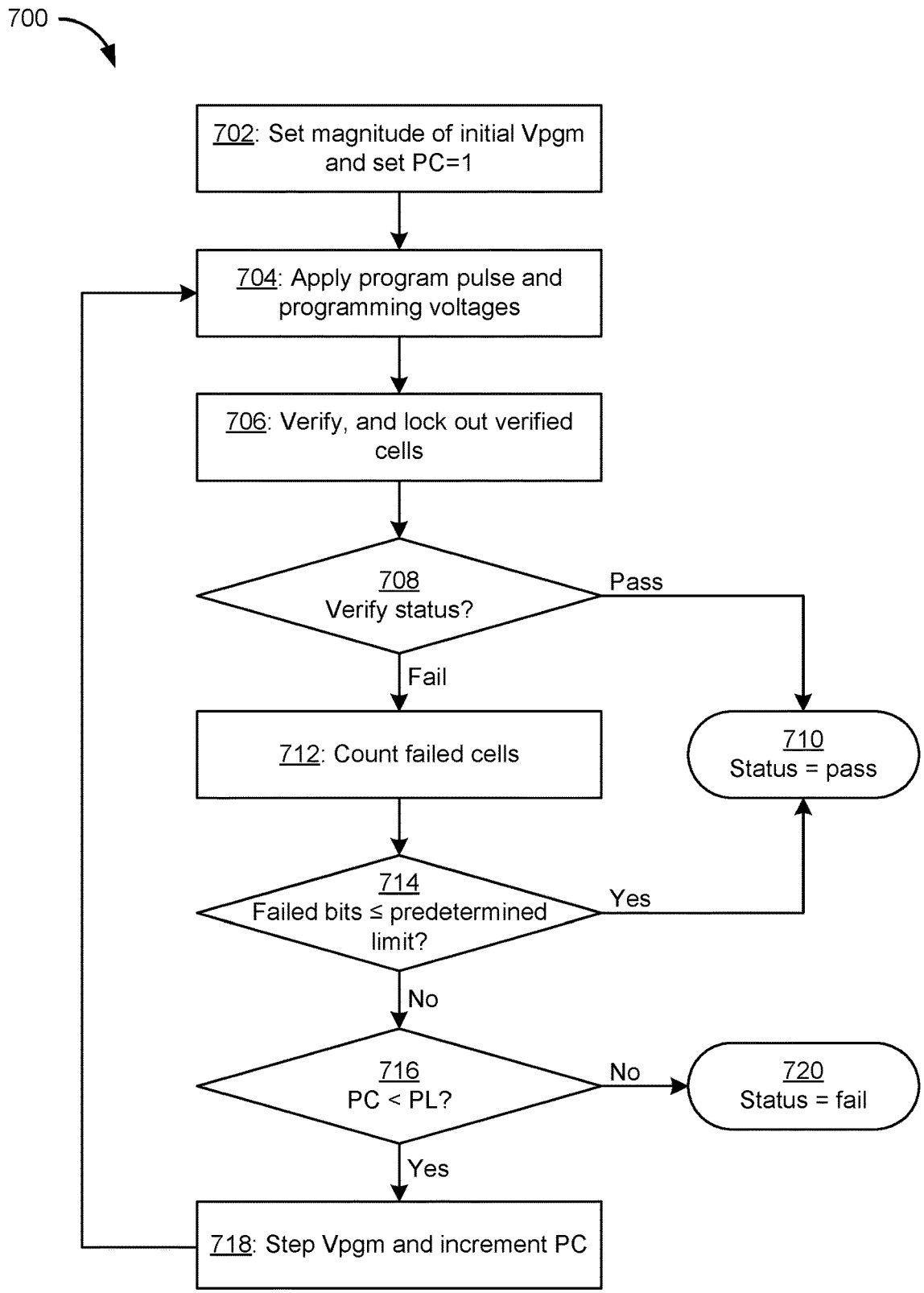
FIG. 7 is a flowchart depicting a process for performing programming operations on a plurality of memory cells in accordance with some implementations.

FIG. 7 is a flowchart depicting a process 700 for performing programming operations on a plurality of memory cells in accordance with some implementations. Process 700 is performed by the storage medium 104 in response to instructions, data and one or more addresses from the storage controller 102. Process 700 can also be used to implement the full sequence programming discussed above. Process 700 can also be used to implement each phase of a multi-phase programming operation such as the multiphase examples in FIGS. 9A-13. Additionally, process 700 can be used to program memory cells connected to the same word line. In some implementations, the storage controller 102 instructs the storage medium 104 which word line (as well as which block or sub-block) should be programmed. Thus, the storage controller 102 is able to manage the order in which word lines are programmed.

Typically, the program voltage applied to the control gates (via a selected word line) during a program operation is applied as a series of program pulses. Between programming pulses are a set of verify pulses to perform verification. In some implementations, the magnitude of the program pulses is increased with each successive pulse by a predetermined step size.

In operation 702, the programming voltage (Vpgm) is initialized to the starting magnitude (e.g., ~12-16V or another suitable level) and a program counter PC maintained by the state machine is initialized at 1.

In operation 704, a program pulse of the program signal Vpgm is applied to the selected word line (the word line selected for programming). In some implementations, the group of memory cells being programmed concurrently are all connected to the same word line (the selected word line). The unselected word lines receive one or more boosting voltages (e.g., ~7-11 volts) to perform one or more boosting schemes.

As discussed above with reference to FIG. 4E, when a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476 (the programming voltage Vpgm). The threshold voltage (Vth) of the memory cell is increased in proportion to the amount of stored charge. The programming may be achieved through FN tunneling of the electrons into the charge trapping layer. For FN tunneling to occur, a high electric field is necessary across the charge trapping layer 473 and the channel 471. This high electric field is achieved by setting the word line of the memory cell to a high voltage Vpgm, and biasing the bit line of the memory cell to ground.

Thus, if a memory cell is selected to be programmed, then the bit line corresponding to the memory cell is grounded while the word line corresponding to the memory cell is subjected to program pulses of the program signal Vpgm.

On the other hand, if a memory cell associated with an asserted word line is not selected to be programmed, then the bit line corresponding to the memory cell is driven high (e.g., connected to Vdd) to prevent FN tunneling, thereby inhibiting programming.

In some implementations, as described in more detail below, driving the bit line corresponding to the memory cell to a level higher than ground but lower than logic high may allow the memory cell to be programmed, although at a slower rate.

In operation 704, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line concurrently have their threshold voltage change, unless they have been locked out from programming.

In operation 706, the appropriate memory cells are verified using the appropriate set of verify reference voltages to perform one or more verify operations. In some implementations, the verification process is performed by testing whether the threshold voltages of the memory cells selected for programming have reached the appropriate verify reference voltage. Memory cells selected for programming that have reached the appropriate verify reference voltage are locked out from subsequent programming pulses of the current programming operation.

In operation 708, it is determined whether all the memory cells have reached their target threshold voltages (pass). If so, the programming process is complete and successful because all selected memory cells were programmed and verified to their target data states. A status of "PASS" is reported in operation 710. If, in 708, it is determined that not all of the memory cells have reached their target threshold voltages (fail), then the programming process continues to operation 712.

In operation 712, the system counts the number of memory cells that have not yet reached their respective target threshold voltage distribution. That is, the system counts the number of memory cells that have, so far, failed the verify process. This counting can be done by the state machine 312, the storage controller 102, or other logic. In one implementation, each of the sense blocks store the status (pass/fail) of their respective cells. In some implementations, there is one total count, which reflects the total number of memory cells currently being programmed that have failed the last verify operation. In some implementations, separate counts are kept for each data state.

In operation 714, it is determined whether the count from operation 712 is less than or equal to a predetermined limit. In some implementations, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in operation 710. In this situation, enough memory cells programmed correctly such that the few remaining memory cells that have not been completely programmed can be corrected using ECC during the read process. In some implementations, operation 712 counts the number of failed cells for each page, each target data state or other unit, and those counts individually or collectively are compared to a threshold in operation 714.

In some implementations, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some implementations, the limit is not predetermined. Instead, it changes based on the number of errors already counted for the page, the number of program/ erase cycles performed or other criteria.

If the number of failed memory cells is not less than the predetermined limit, than the programming process continues at operation 716 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in operation 720. This is one example of a program fault. If the program counter PC is less than the program limit value PL, then the process continues at operation 718 during which time the program counter PC is incremented by 1 and the program voltage Vpgm is stepped up to the next magnitude. For example, the next pulse has a magnitude greater than the previous pulse by a step size (e.g., a step size of 0.1-0.5 volts). After operation 718, the process loops back to operation 704 and another program pulse is applied to the selected word line so that another iteration (operations 704-718) of the programming process 700 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5A) or verify operation (e.g. see verify reference voltages Vv1, Vv2, Vv3, Vv4, Vv5, Vv6, and Vv7 of FIG. 5A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods for verifying/reading. Other read and verify techniques can also be used.

In some implementations, the storage controller 102 receives a request from the host (or a client, user, etc.) to program host data (data received from the host) into the memory system. In some implementations, the storage controller 102 arranges the host data to be programmed into units of data. For example, the storage controller 102 can arrange the host data into pages, partial pages (a subset of a page), word line units, blocks, jumbo blocks, or other units.

Figure 8A:
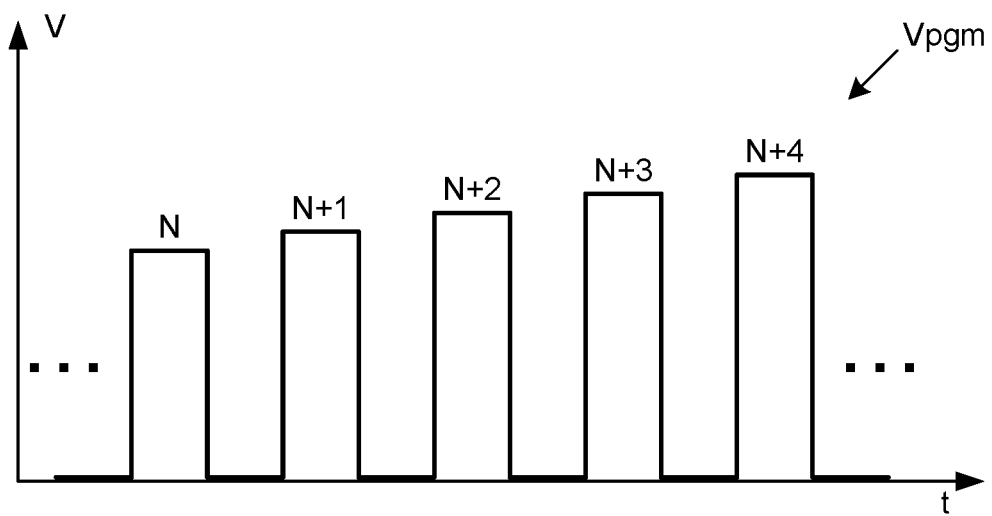
FIG. 8A depicts an example program signal as described with reference to operation 704 in FIG. 7 in accordance with some implementations.

FIG. 8A depicts an example program signal Vpgm as described above with reference to operation 704 in accordance with some implementations. The program signal Vpgm includes a plurality of program pulses, including pulse N, pulse N+1, pulse N+2, and so forth. The magnitude of the program pulses may be increased with each successive pulse by a predetermined step size.

Figure 8B:
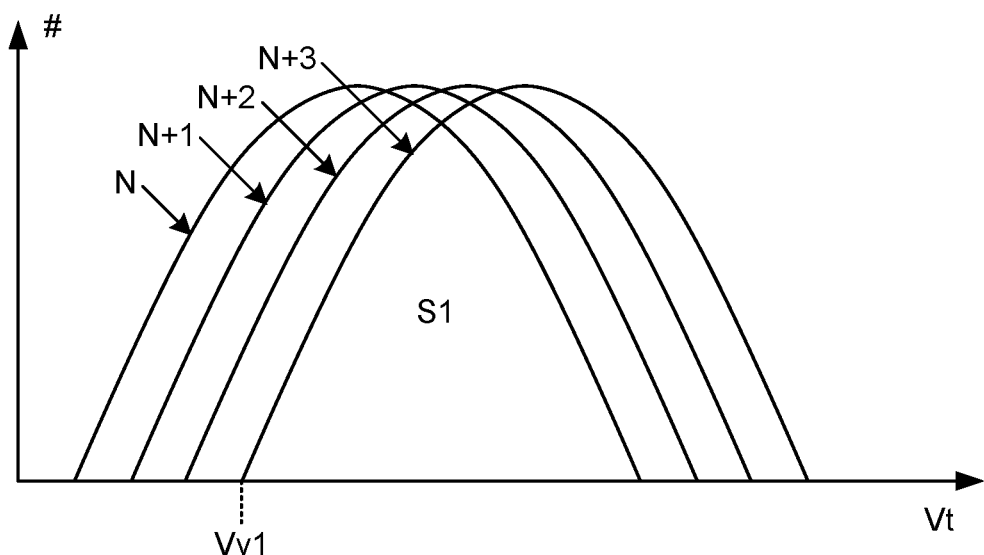
FIG. 8B depicts a voltage distribution as described with reference to FIGS. 5A-5C and 9A-15 as the associated memory cells are subjected to successive programming pulses in accordance with some implementations.

FIG. 8B depicts a voltage distribution S1 (as described herein with reference to FIGS. 5A-5C and 9A-15) as the associated memory cells are subjected to successive programming pulses. The program pulses correspond to those depicted in FIG. 8A. With each successive program pulse, the threshold voltages of the memory cells associated with the voltage distribution S1 increase, thereby causing the successive distribution curves to move to the right. After each program pulse, control circuitry of the storage medium 104 tests (e.g., performs sense operations) the memory cells associated with the S1 state to determine whether the memory cells have a threshold voltage greater than or equal to Vv1 (as described above with reference to FIGS. 5A and 7). If a threshold of the memory cells do not have a voltage threshold above Vv1 (e.g., as a result of pulse N), then the next program pulse is applied (e.g., pulse N+1) to the memory cells. When at least a threshold of memory cells (e.g., determined by ECC capabilities of the storage controller 102 as described above) have a threshold voltage greater than or equal to Vv1, the program operation for those memory cells is complete.

Figure 9A:
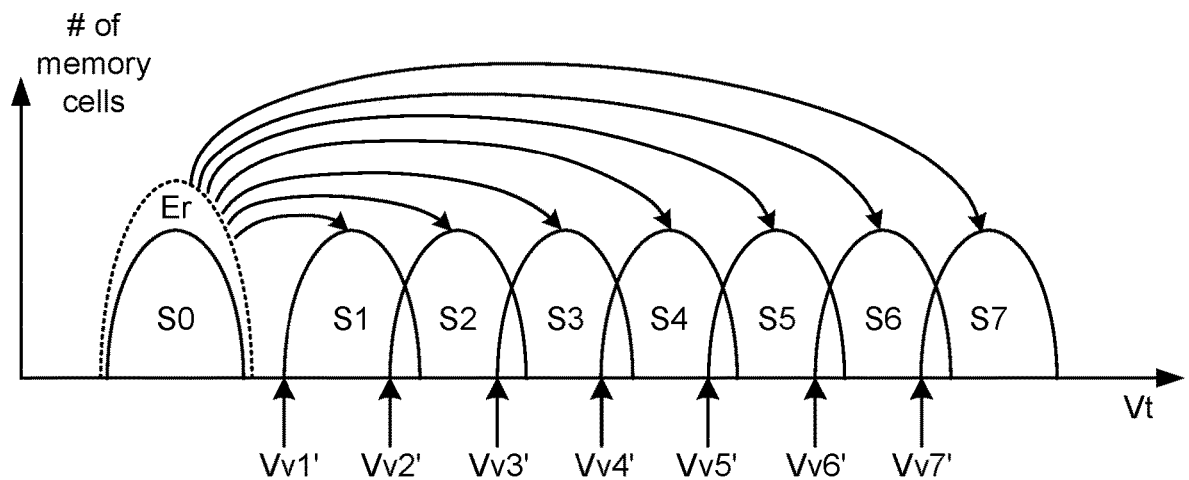
FIG. 9A depicts the first phase of a multiphase programming operation, which includes programming memory cells from an erased state to any of programmed data states S1-S7 in accordance with some implementations.
Figure 9B:
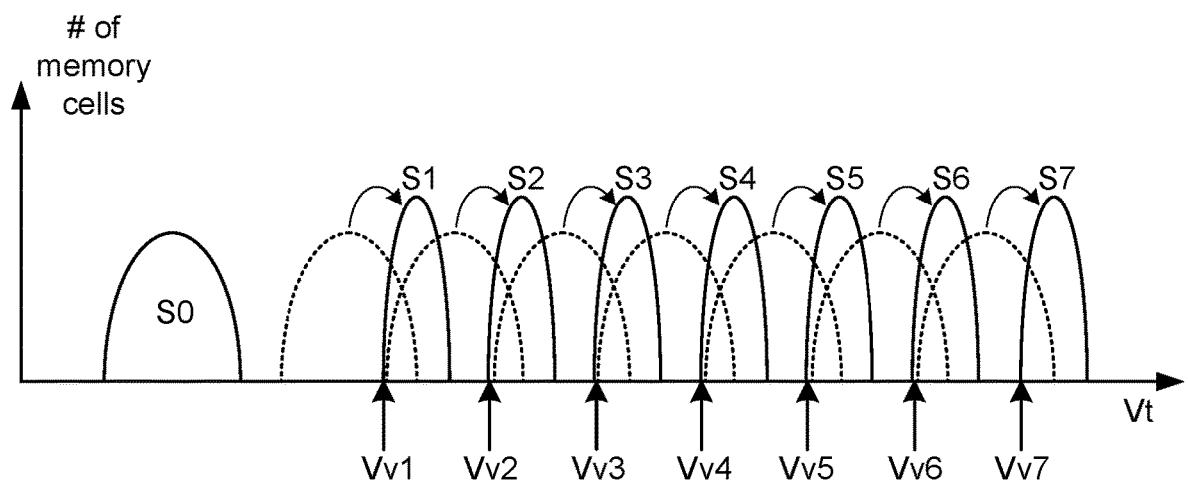
FIG. 9B depicts the second (and last) phase of a multiphase programming operation, including programming memory cells to tighten (decrease the width of) the threshold distributions in accordance with some implementations.

As noted above, process 700 may be used to implement a multiphase programming operation. FIG. 9A-9B depict a multiphase programming operation that has a coarse phase (FIG. 9A) followed by a fine phase (FIG. 9B) in accordance with some implementations. In some implementations, process 700 is performed once for each phase of a multiphase programming operation.

FIG. 9A depicts the first phase of the multiphase programming operation, which includes programming the memory cells from the erased state (S0) to any of the programmed data states S1-S7, similar to full sequence programming. However, rather than using the standard verify reference voltages (e.g., Vv1, Vv2, Vv3, Vv4, Vv5, Vv6, and Vv7), the process of FIG. 9A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 9A can be thought of as intermediate threshold voltage distributions (or intermediate data states) that are at lower voltages than the threshold voltages of FIG. 5A. Note that memory cells in the erased state S0 that are to be in data state S0, are inhibited from programming.

FIG. 9B depicts the second (and last) phase of the multiphase programming operation, which includes programming the memory cells to tighten (decrease the width of) the threshold distributions. Thus, the memory cells are programmed from (i) the intermediate threshold voltage distributions (or data states) of FIG. 9A using the alternate set of verify reference voltages (e.g., Vv1', Vv2', Vv3', Vv4,' Vv5', Vv6', and Vv7') to (ii) the final or target threshold voltage distributions (or data states) of FIG. 9B using the standard verify reference voltages (e.g., Vv1, Vv2, Vv3, Vv4, Vv5, Vv6, and Vv7). FIG. 9A may be referred to as the coarse, rough, foggy, or intermediate phase, and FIG. 9B may be referred to as the final, target, fine, or high-accuracy phase. In some implementations, the coarse phase of FIG. 9A is performed for a given word line, followed by the coarse phase for the next word line. The coarse phase for the next word line could give rise to interference for the given word line, thereby widening the intermediate threshold voltage distributions, which could lead to errors when reading the data. However, the fine phase of a given word line may subsequently be performed after the coarse phase for the next word line, removing or reducing the effects of interference from the next word line. Note that memory cells in the erased state Er that are to be in data state S0 are inhibited from programming.

In some implementations, the coarse-fine program scheme is implemented in a Bit-Cost-Scalable (BiCs) architecture. FIGS. 9A and 9B depict an example in which memory cells are programmed to three bits per memory cell. In some implementations, memory cells are programmed to four bits per memory cell (referred to herein as "QLC", quad level cell). A coarse-fine program scheme can compensate for Neighbor Word line Interference ("NWI") effect significantly by reducing the threshold voltage (Vt) difference between coarse and fine. A coarse-fine program scheme may be used to program memory cells that store two, three, four, five, or more than five bits per cell.

In some implementations after performing the first programming phase depicted in FIG. 9A on a given word line, the first programming phase depicted in FIG. 9A is performed on another word line that is later in the sequence. Afterwards, the second programming phase depicted in FIG. 9B is performed on the given word line.

Figure 10A:
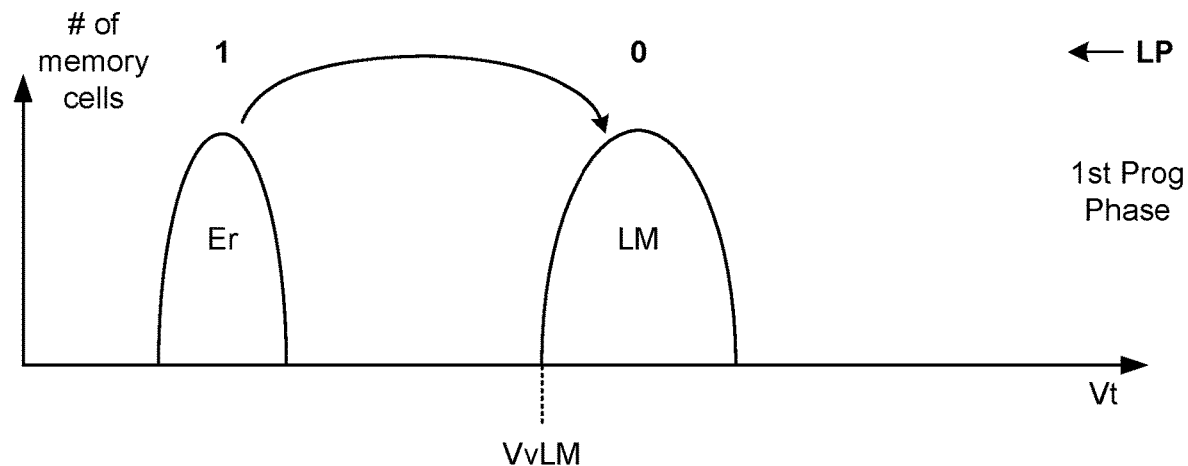
FIG. 10A depicts the first programming phase of a multiphase programming technique in accordance with some implementations.
Figure 10B:
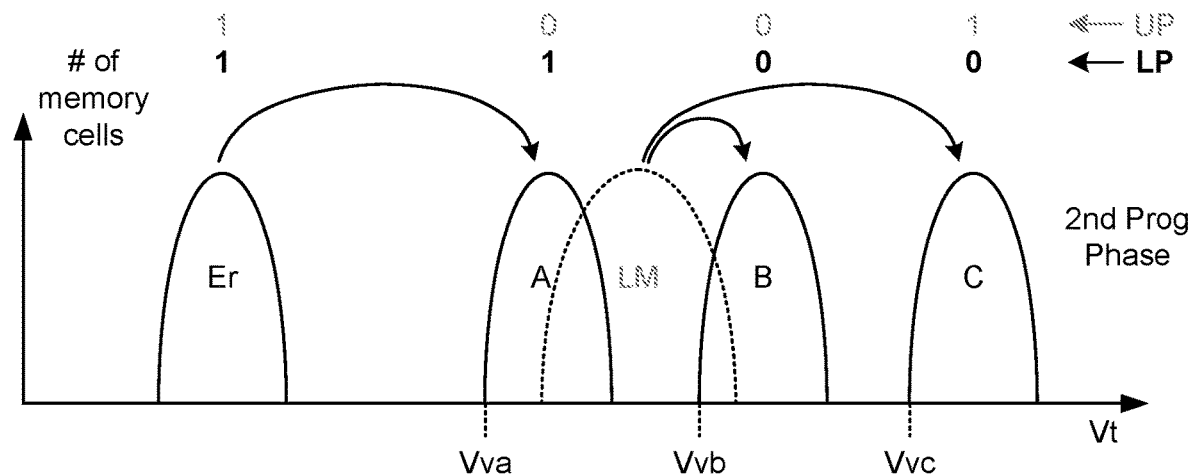
FIG. 10B depicts a second (and final) programming phase of a multiphase programming technique in accordance with some implementations.

FIGS. 10A-10B depict a multiphase programming technique that programs one bit into each memory cell with each programming phase. This example depicts two bits per memory cell, but the example can be extended to a greater number of bits per memory cell. FIG. 10A depicts the first programming phase and FIG. 10B depicts the second programming phase.

FIG. 10A depicts the first programming phase of the multiphase programming technique in accordance with some implementations. In the first programming phase, the lower page (LP) is programmed for a selected word line. If the lower page is to remain data 1, then the memory cell state remains at state Er. If the lower page data is to be programmed to 0, then the threshold voltage of the memory cells on the selected word line is raised (as described above with reference to FIGS. 7 and 8B) such that the memory cell is programmed to an intermediate (LM or lower-middle) state.

FIG. 10B depicts a second (and final) programming phase of the multiphase programming technique in accordance with some implementations. In the second programming phase, the upper page (UP) is programmed for the selected word line. For LP=1, if UP is to remain 1, then the memory cell state remains at state Er, but if UP is to be programmed to 0, then the threshold voltage of the memory cells on the selected word line is raised such that the memory cell is programmed to the A state. In other words, the A-state memory cells are programmed from the Er-state distribution to the A-state distribution. Similarly, for LP=0, UP=0 (B-state) memory cells are programmed from the LM-state distribution to the B-state distribution, and UP=1 (C-state) memory cells are programmed from the LM-state distribution to the C-state distribution.

In some implementations after performing the first programming phase depicted in FIG. 10A on a given word line, the first programming phase depicted in FIG. 10A is performed on another word line that is later in the sequence. Afterwards, the second programming phase depicted in FIG. 10B is performed on the given word line.

FIGS. 11A-11B illustrate examples of program distributions after a first programming phase in MLC mode and a second programming phase in QLC mode using a multiphase mapping. While the example illustrated in FIGS. 11A-11B demonstrate a MLC to QLC mapping, it should be understood that the described techniques are generally applicable to multiphase programming of multi-level memory cells with various numbers of bits per cell. Thus, one or more aspects of the present technology may utilize memory cells with any number of states.

The programming technique depicted in FIGS. 11A-11B may be referred to as an MLC-fine programming technique, in that the first (MLC) phase programs the memory cells to four states (corresponding to two bits per state), and the second (fine) phase programs the memory cells to sixteen states (corresponding to four bits per state). The second phase results in QLC memory cells.

FIG. 11A represents memory cell voltage distributions after programming the first phase, wherein QLC memory cells are programmed in an MLC mode. Four distributions corresponding to the erased state (S0, mapped to "11"), first state (S4, mapped to "10"), second state (S8, mapped to "00"), and third state (S12, mapped to "01") are programmed into a voltage range from 0 to a maximum voltage level (e.g., 5V). Programming of the first phase may use any suitable MLC programming technique. For example, programming and verify pulses (as described above with reference to FIGS. 7-8B) may be alternated until the last verify pulse indicates that all of the programmed memory cells meet or exceed the program verify voltage for the desired program state. The MLC mode may use a 1-2 Gray code, wherein the lower page (LP) has one transition (between the S4 and S8 states) and the middle page (MP) has two transitions (first between the S0 and S4 states, and second between the S8 and S12 states). The concepts described herein may be extended to other Gray code schemes.

FIG. 11B represents memory cell voltage distributions after programming the second phase, wherein the QLC memory cells programmed in FIG. 11A are extended into a QLC mode. The voltage range widens to a second maximum voltage (e.g., approximately 6.2V). Sixteen distributions are present, which correspond to the erased state (S0, mapped to "1111"), first state (S1, mapped to "1110"), second state (S2, mapped to "1100"), and so forth until the fifteenth state (S15, mapped to "0111").

To extend the MLC distributions in FIG. 11A to the QLC distributions in FIG. 11B, the second phase of programming may begin by reading the existing programmed data in the memory cells after the first phase, or the MLC bits (LP and MP), which correspond to the lower page (LP) and middle page (MP) QLC bits. Alternative mappings may be used. According to the four data bits to be programmed in each memory cell (according to data from a write operation), the QLC mapping in FIG. 11B can be used to determine how much additional voltage, if any, needs to be programmed into each memory cell to extend the original MLC state into a final QLC state.

For example, in one approach, if the data to be programmed into a particular memory cell corresponds to the bits "1000" and a read of the particular memory cell determines a read voltage within the MLC "10" (S4) distribution, then according to the QLC mapping in FIG. 11B, the final state mapping to "1000" corresponds to QLC state S5, which has a target voltage corresponding to the middle of a voltage distribution for the QLC state S5. Thus, the additional voltage to program can be determined from a difference between the target voltage (in distribution S5) and the determined read voltage (in distribution S4).

The multiphase MLC-fine programming scheme depicted in FIGS. 11A-11B may be optimized to ensure data protection in the event of power loss at any phase of the programming. As a result of the first programming phase, the lower page (LP) data can be read using $V_{LP}$ as a read reference voltage (e.g., LP=1 for memory cells having a Vt less than $V_{LP}$, and LP=0 for memory cells having a Vt greater than $V_{LP}$). Similarly, as a result of the first programming phase, the middle page (MP) data can be read using $V_{MP1}$ and $V_{MP2}$ as read reference voltages (e.g., MP=1 for memory cells having a Vt less than $V_{MP1}$ or greater than $V_{MP2}$, and MP=0 for memory cells having a Vt greater than $V_{MP1}$ and less than $V_{MP2}$). As such, if there is a loss of power to the storage system 100 upon completion of the first (MLC) programming phase, the LP and MP data may be recovered using the read reference voltages as described above.

In an optimal scenario, the LP and MP data may also be recoverable if there is a loss of power to the storage system 100 during the second (fine) programming phase.

For example, LP=1 and MP=1 for MLC state S0. During the second programming phase, QLC cells for states S0-S3 are programmed with state S0 as a starting point. For each state S0-S3, LP=1 and MP=1, the same as it was in the MLC phase. As such, even if there is power loss before the second programming phase is complete (and QLC states S0-S3 are still overlapping as a result), the LP and MP data for these states may be recovered using the read reference voltages as described above.

Similarly, LP=1 and MP=0 for MLC state S4. During the second programming phase, QLC cells for states S4-S7 are programmed with state S4 as a starting point. For each state S4-S7, LP=1 and MP=0, the same as it was in the MLC phase. As such, even if there is power loss before the second programming phase is complete (and QLC states S4-S7 are still overlapping as a result), the LP and MP data for these states may be recovered using the read reference voltages as described above.

Similarly, LP=0 and MP=0 for MLC state S8. During the second programming phase, QLC cells for states S8-S11 are programmed with state S8 as a starting point. For each state S8-S11, LP=0 and MP=0, the same as it was in the MLC phase. As such, even if there is power loss before the second programming phase is complete (and QLC states S8-S11 are still overlapping as a result), the LP and MP data for these states may be recovered using the read reference voltages as described above.

Similarly, LP=0 and MP=1 for MLC state S12. During the second programming phase, QLC cells for states S12-S15 are programmed with state S12 as a starting point. For each state S12-S15, LP=0 and MP=1, the same as it was in the MLC phase. As such, even if there is power loss before the second programming phase is complete (and QLC states S12-S15 are still overlapping as a result), the LP and MP data for these states may be recovered using the read reference voltages as described above.

As discussed above, LP and MP data may be recoverable if QLC cells programmed from the same MLC state are overlapping (e.g., overlap in S0-S3, overlap in S4-S7, overlap in S8-S11, or overlap in S12-S15). However, LP and MP data may not be recoverable if QLC cells programmed from different MLC states are overlapping (e.g., overlap in S3-S4, overlap in S7-S8, or overlap in S11-S12). If there is overlap in any of the latter scenarios during any stage of the second programming phase (e.g., during any of pulse N through N+4 as described above with reference to FIGS. 8A-8B), then LP and MP data may not be recoverable in the event of a power loss. This is because such overlapping distributions would traverse the read reference voltages $V_{LP}$, $V_{MP1}$, and/or $V_{MP2}$. A memory cell having a threshold voltage Vt in one of these overlapped areas (e.g., between S3 and S4) could represent LP or MP data from either side of the read reference voltage (e.g., MP for the memory cell could be 1 or 0, with no way to determine which one is correct).

Figure 12:
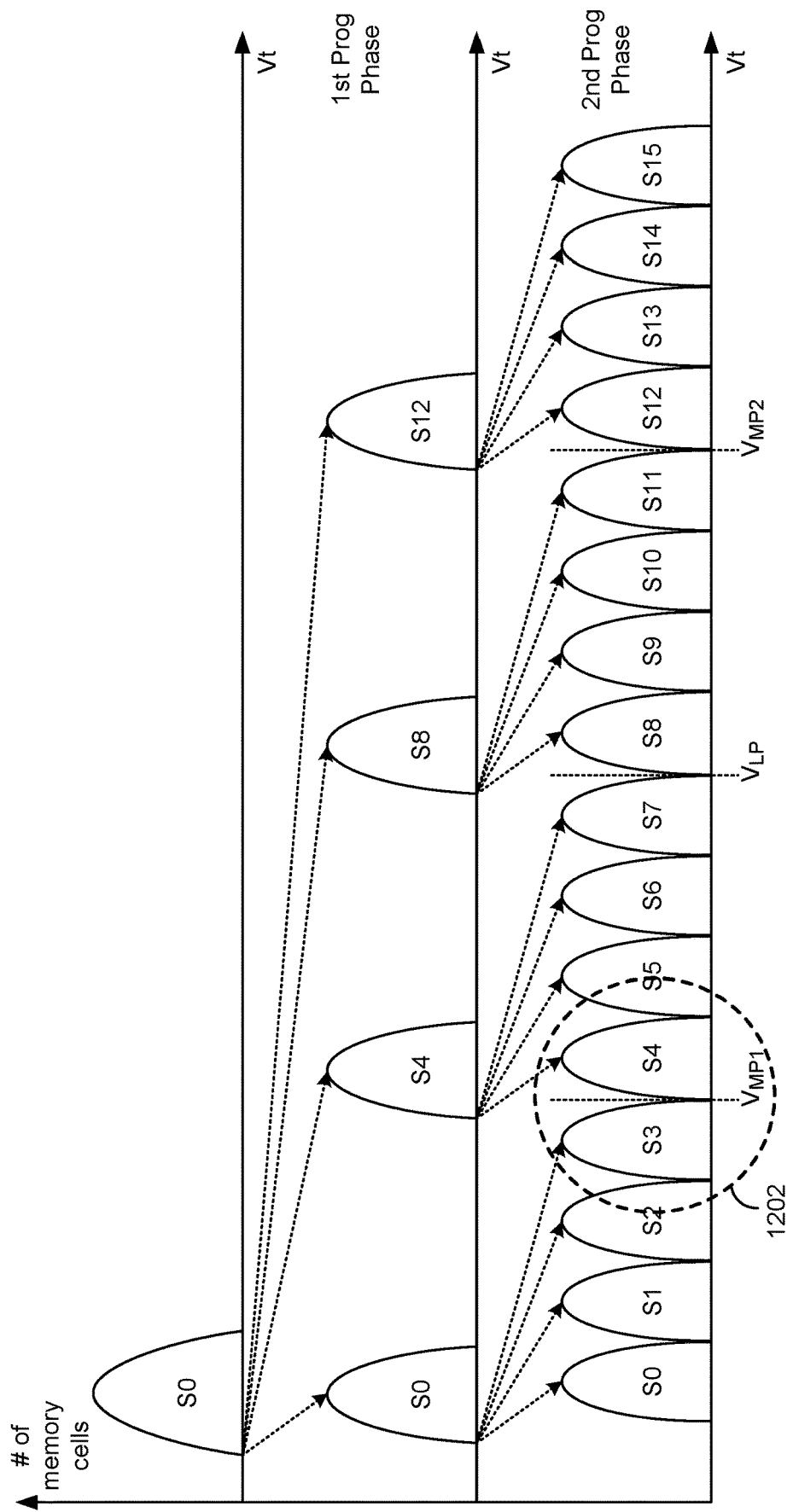
FIG. 12 is another depiction of the multiphase QLC-fine programming technique described with reference to FIGS. 11A-11B in accordance with some implementations.

FIG. 12 is another depiction of the multiphase QLC-fine programming technique described above with reference to FIGS. 11A-11B. As described above, in the first (MLC) programming phase, an erased state S0 is programmed to four MLC states S0, S4, S8, and S12. In the second (fine) programming phase, the four MLC states are programmed to sixteen QLC states S0-S15. The data represented by each state is not included so as not to obscure more pertinent aspects of the implementations disclosed herein. However, the read reference voltages $V_{LP}$, $V_{MP1}$, and $V_{MP2}$ in FIG. 12 correspond to those described above with reference to FIGS. 11A-11B, as well as the details regarding data recoverability in overlapping states.

As described above, if states S3 and S4 (area 1202) overlap during any stage of programming in the second phase (e.g., during programming pulses N through N+4, see FIGS. 8A-8B), the LP and MP data may not be recoverable if there is a power loss during any such stage. Similarly, if states S7 and S8 overlap during any stage of programming in the second phase, the LP and MP data may not be recoverable if there is a power loss during any such stage. Similarly, if states S11 and S12 overlap during any stage of programming in the second phase, the LP and MP data may not be recoverable if there is a power loss during any such stage.

One way to ensure no data loss in such scenarios is to store the LP and MP data in cache memory (e.g., in SLC memory cells) during the second programming phase. However, for the reasons mentioned above (e.g., reduction of available device space for other productive uses such as storing user data and overprovisioning), it would be advantageous to program the QLC cells in the second programming phase such that the voltage distributions do not overlap at any stage during the programming. As a result of such programming, the LP and MP data would be recoverable at all stages of the second programming phase, thereby eliminating the need for temporary storage of the LP and MP data in expensive cache memory.

Figure 13:
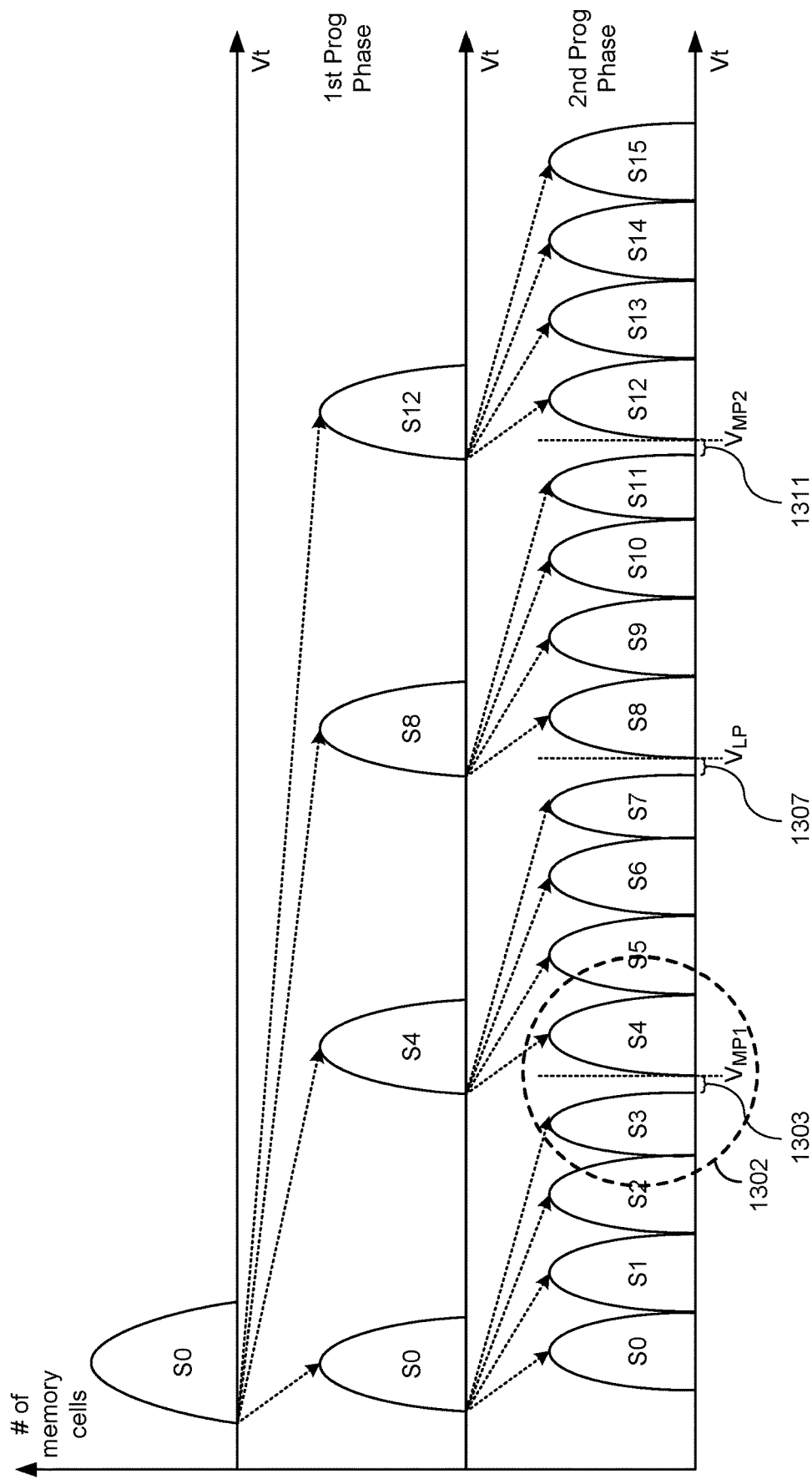
FIG. 13 is another depiction of the multiphase QLC-fine programming technique described with reference to FIGS. 11A-11B and FIG. 12 in accordance with some implementations.

FIG. 13 is another depiction of the multiphase QLC-fine programming technique described above with reference to FIGS. 11A-11B and FIG. 12. As described above, in the first (MLC) programming phase, an erased state S0 is programmed to four MLC states S0, S4, S8, and S12. In the second (fine) programming phase, the four MLC states are programmed to sixteen QLC states S0-S15. The data represented by each state is not included so as not to obscure more pertinent aspects of the implementations disclosed herein. However, the read reference voltages $V_{LP}$, $V_{MP1}$, and $V_{MP2}$ in FIG. 13 correspond to those described above with reference to FIGS. 11A-11B and FIG. 12, as well as the details regarding data recoverability in overlapping states.

In FIG. 13, groups of QLC states corresponding to respective MLC states do not overlap. Stated another way, no QLC state having been programmed from a given MLC state (e.g., MLC S0) overlaps with a QLC state having been programmed from an MLC state other than the given MLC state (e.g., MLC S4/S8/S12). The avoidance of overlap persists throughout every stage of programming (e.g., during programming pulses N through N+4, see FIGS. 8A-8B). Stated another way, QLC states straddling the read reference voltages for LP and MP data ($V_{MP1}$, $V_{LP}$, and $V_{MP2}$) do not overlap at any point during the second programming phase. As a result, LP and MP data may be recovered if a power loss occurs at any point during the second programming phase.

Specifically, in the multiphase QLC-fine programming technique depicted in FIG. 13, QLC states S3 and S4 (area 1302) do not overlap throughout the second programming phase, providing a margin 1303 associated with the read reference voltage $V_{MP1}$. Similarly, QLC states S7 and S8 do not overlap throughout the second programming phase, providing a margin 1307 associated with the read reference voltage $V_{LP}$. Similarly, QLC states S11 and S12 (area 1311) do not overlap throughout the second programming phase, providing a margin 1311 associated with the read reference voltage $V_{MP2}$. Margins 1303, 1307, and 1311 ensure no memory cells (or less than an acceptable threshold of memory cells) have a threshold voltage corresponding to data states on both sides of a given read reference voltage. As such, the LP and MP data for the states on both sides of each read reference voltage may be recovered despite any power loss occurring during the second programming phase.

Figure 14:
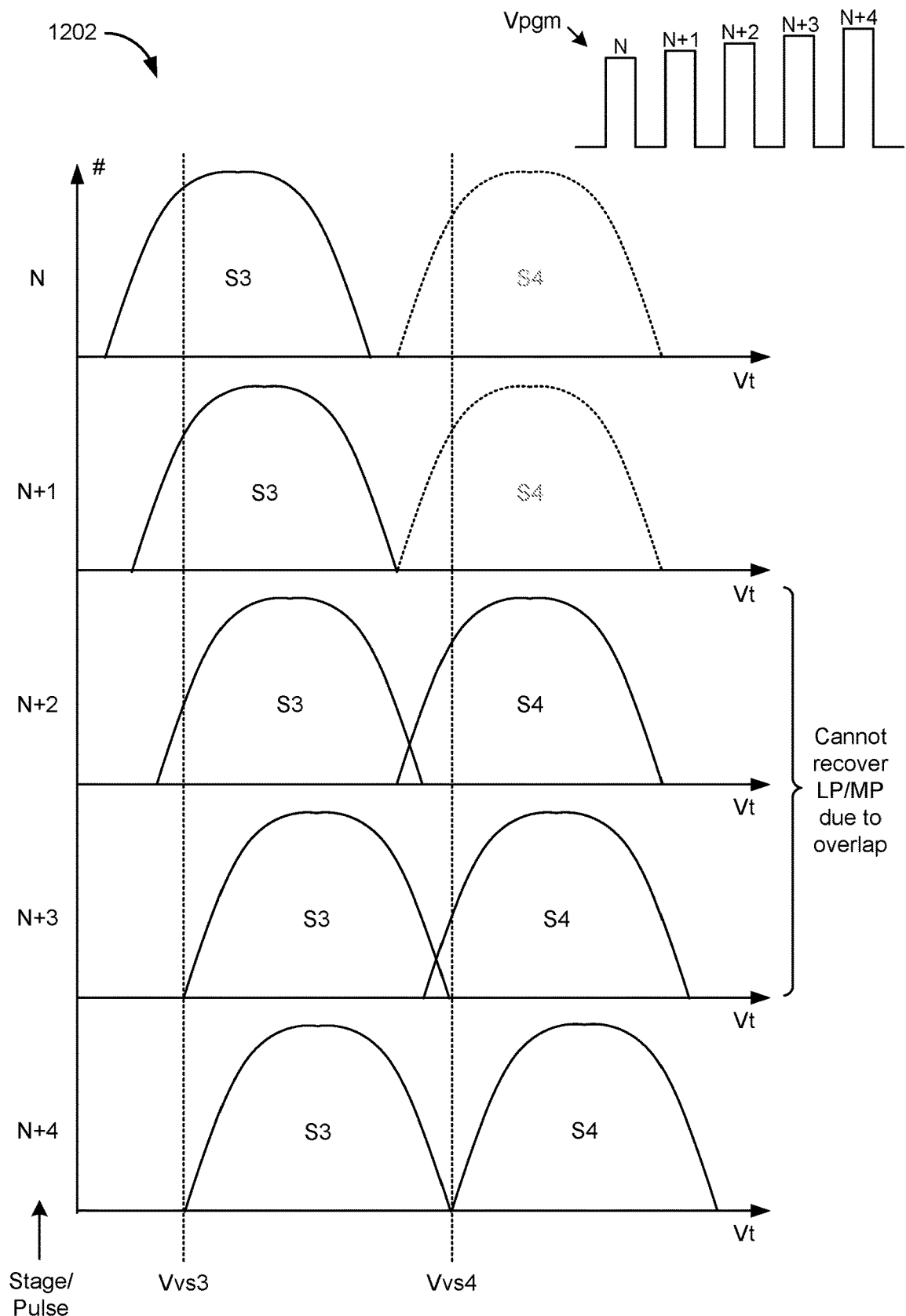
FIG. 14 depicts a detailed view of a plurality of stages of the second programming phase of data states S3 and S4 in area 1202 of the programming scheme depicted in FIG. 12 in accordance with some implementations.

FIG. 14 depicts a detailed view of a plurality of stages of the second programming phase of data states S3 and S4 in area 1202 of the programming scheme depicted in FIG. 12. Each stage corresponds to a programming pulse N through N+4, as described above with reference to FIGS. 7 and 8A-8B.

In the first stage N, data states S0, S1, and S2 have likely been verified and are inhibited from being further programmed. Memory cells designated to be programmed to QLC state S3 are subjected to a first program pulse (704, FIG. 7). Memory cells designated to be programmed to state S4 are not subjected to the first program pulse, because the first problem program pulse is not high enough to affect the threshold voltages Vt of the S4 memory cells. After the first program pulse, a verification operation (706, FIG. 7) is performed to determine whether all of the cells (or a minimum acceptable threshold of cells) have threshold voltages Vt above the verify reference voltage Vvs3. Upon a determination that programming is not complete for state S3 (718, FIG. 7), the next programming stage (N+1) commences.

In the next stage N+1, memory cells designated to be programmed to QLC state S3 are subjected to a second program pulse (704, FIG. 7). Memory cells designated to be programmed to state S4 are not subjected to the first program pulse, because the first problem program pulse is not high enough to affect the threshold voltages Vt of the S4 memory cells. After the second program pulse, a verification operation (706, FIG. 7) is performed to determine whether all of the cells (or a minimum acceptable threshold of cells) have threshold voltages Vt above the verify reference voltage Vvs3. Upon a determination that programming is not complete for state S3 (718, FIG. 7), the next programming stage (N+2) commences.

In the next stage N+2, memory cells designated to be programmed to QLC state S3 are subjected to a third program pulse (704, FIG. 7). Also in this stage (N+2), memory cells designated to be programmed to QLC state S4 are subjected to the third program pulse (704, FIG. 7). After the third program pulse, verification operations (706, FIG. 7) are performed to determine whether all (or an acceptable threshold) of the S3 cells have threshold voltages Vt above the verify reference voltage Vvs3, and to determine whether all (or an acceptable threshold) of the S4 cells have threshold voltages Vt above the verify reference voltage Vvs4. Upon a determination that programming is not complete for states S3 and S4 (718, FIG. 7), the next programming stage (N+3) commences.

Importantly, states S3 and S4 overlap during this programming stage. As a result of this overlap, the LP and MP data cannot be recovered in the event of a power loss during this programming stage.

In the next stage N+3, memory cells designated to be programmed to QLC state S3 are subjected to a fourth program pulse (704, FIG. 7). Also in this stage (N+3), memory cells designated to be programmed to QLC state S4 are subjected to the fourth program pulse (704, FIG. 7). After the fourth program pulse, verification operations (706, FIG. 7) are performed to determine whether all (or an acceptable threshold) of the S3 cells have threshold voltages Vt above the verify reference voltage Vvs3, and to determine whether all (or an acceptable threshold) of the S4 cells have threshold voltages Vt above the verify reference voltage Vvs4. Programming for S3 is determined to be complete (710, FIG. 7), and the S3 memory cells are therefore locked out from being affected by subsequent programming pulses. However, upon a determination that programming is not complete for state S4 (718, FIG. 7), the next programming stage (N+4) commences.

Importantly, states S3 and S4 overlap during this programming stage as well. As a result of this overlap, the LP and MP data cannot be recovered in the event of a power loss during this programming stage, even though one of the states (S3) has completed programming.

In the next stage N+4, memory cells designated to be programmed to QLC state S4 are subjected to a fifth program pulse (704, FIG. 7). After the fifth program pulse, verification operations (706, FIG. 7) are performed to determine whether all (or an acceptable threshold) of the S4 cells have threshold voltages Vt above the verify reference voltage Vvs4. Programming for S4 is determined to be complete (710, FIG. 7), and the S4 memory cells are therefore locked out from being affected by subsequent programming pulses. Since states S3 and S4 no longer overlap, the LP and MP data may be recovered in the event of a power loss upon completion of this programming stage.

As depicted in FIG. 14, LP and MP data cannot be recovered in the event of a power loss during stages N+2 and N+3 due to the overlap between states S3 and S4 during these stages.

Figure 15:
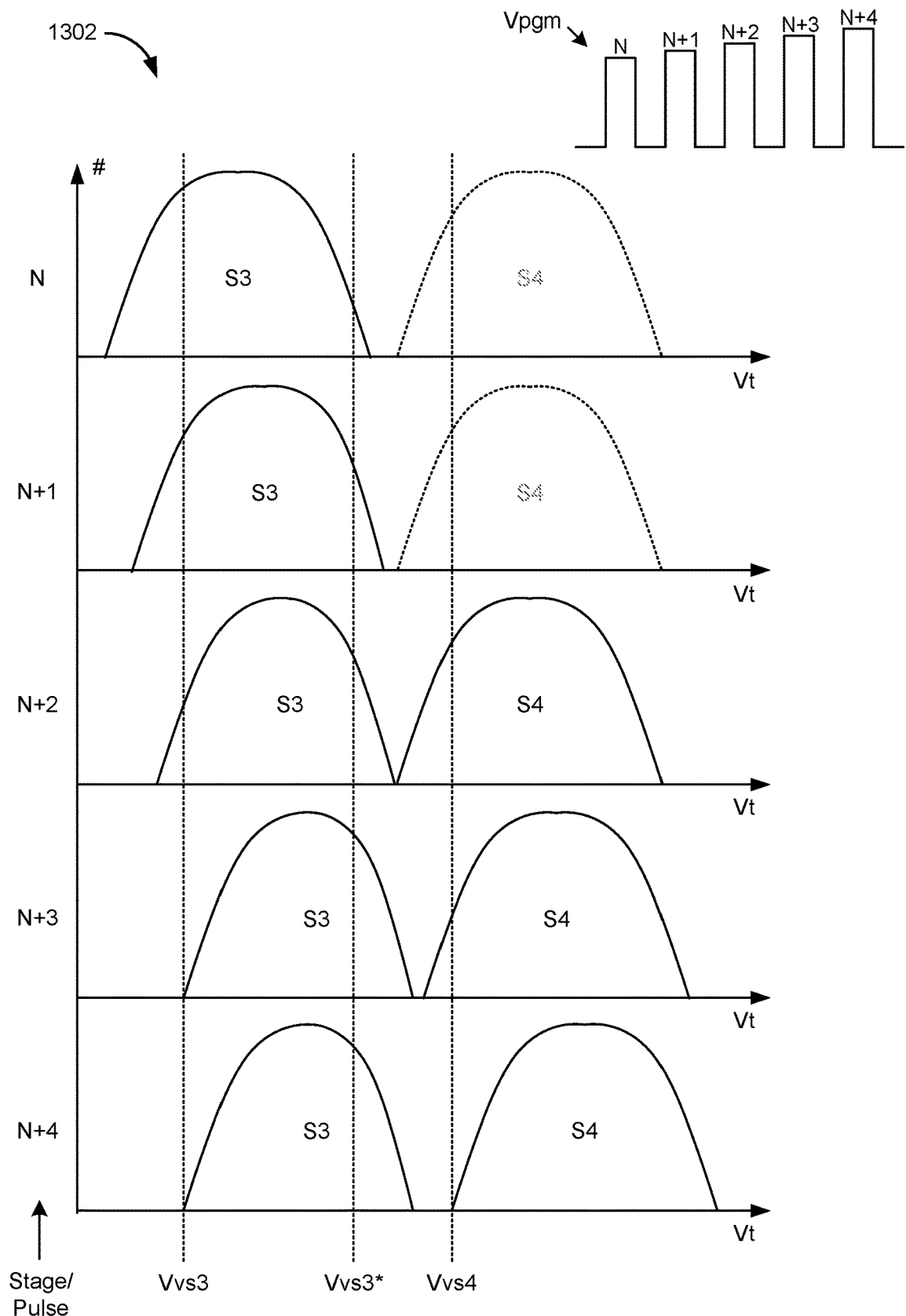
FIG. 15 depicts a detailed view of a plurality of stages of the second programming phase of data states S3 and S4 in area 1302 of the programming scheme depicted in FIG. 13 in accordance with some implementations.

FIG. 15 depicts a detailed view of a plurality of stages of the second programming phase of data states S3 and S4 in area 1302 of the programming scheme depicted in FIG. 13. Each stage corresponds to a programming pulse N through N+4, as described above with reference to FIGS. 7 and 8A-8B.

In the first stage N, data states S0, S1, and S2 have likely been verified and are inhibited from being further programmed. Memory cells designated to be programmed to QLC state S3 are subjected to a first program pulse (704, FIG. 7). Memory cells designated to be programmed to state S4 are not subjected to the first program pulse, because the first problem program pulse is not high enough to affect the threshold voltages Vt of the S4 memory cells. After the first program pulse, a verification operation (706, FIG. 7) is performed to determine whether all of the cells (or a minimum acceptable threshold of cells) have threshold voltages Vt above the verify reference voltage Vvs3. Upon a determination that programming is not complete for state S3 (718, FIG. 7), the next programming stage (N+1) commences.

In the next stage N+1, memory cells designated to be programmed to QLC state S3 are subjected to a second program pulse (704, FIG. 7). Memory cells designated to be programmed to state S4 are not subjected to the first program pulse, because the first problem program pulse is not high enough to affect the threshold voltages Vt of the S4 memory cells. After the second program pulse, a verification operation (706, FIG. 7) is performed to determine whether all of the cells (or a minimum acceptable threshold of cells) have threshold voltages Vt above the verify reference voltage Vvs3. Upon a determination that programming is not complete for state S3 (718, FIG. 7), the next programming stage (N+2) commences.

In the next stage N+2, memory cells designated to be programmed to QLC state S3 are subjected to a third program pulse (704, FIG. 7). Also in this stage (N+2), memory cells designated to be programmed to QLC state S4 are subjected to the third program pulse (704, FIG. 7). After the third program pulse, verification operations (706, FIG. 7) are performed to determine whether all (or an acceptable threshold) of the S3 cells have threshold voltages Vt above the verify reference voltage Vvs3, and to determine whether all (or an acceptable threshold) of the S4 cells have threshold voltages Vt above the verify reference voltage Vvs4. Upon a determination that programming is not complete for states S3 and S4 (718, FIG. 7), the next programming stage (N+3) commences.

In contrast to the example depicted in FIG. 14, states S3 and S4 do not overlap during this programming stage, thereby allowing for recovery of LP and MP data in the event of a power loss during this programming stage.

In the next stage N+3, memory cells designated to be programmed to QLC state S3 are subjected to a fourth program pulse (704, FIG. 7). Also in this stage (N+3), memory cells designated to be programmed to QLC state S4 are subjected to the fourth program pulse (704, FIG. 7). After the fourth program pulse, verification operations (706, FIG. 7) are performed to determine whether all (or an acceptable threshold) of the S3 cells have threshold voltages Vt above the verify reference voltage Vvs3, and to determine whether all (or an acceptable threshold) of the S4 cells have threshold voltages Vt above the verify reference voltage Vvs4. Programming for S3 is determined to be complete (710, FIG. 7), and the S3 memory cells are therefore locked out from being affected by subsequent programming pulses. However, upon a determination that programming is not complete for state S4 (718, FIG. 7), the next programming stage (N+4) commences.

In contrast to the example depicted in FIG. 14, states S3 and S4 do not overlap during this programming stage, thereby allowing for recovery of LP and MP data in the event of a power loss during this programming stage.

In the next stage N+4, memory cells designated to be programmed to QLC state S4 are subjected to a fifth program pulse (704, FIG. 7). After the fifth program pulse, verification operations (706, FIG. 7) are performed to determine whether all (or an acceptable threshold) of the S4 cells have threshold voltages Vt above the verify reference voltage Vvs4. Programming for S4 is determined to be complete (710, FIG. 7), and the S4 memory cells are therefore locked out from being affected by subsequent programming pulses. Since states S3 and S4 do not overlap, the LP and 1VIP data may be recovered in the event of a power loss upon completion of this programming stage.

As depicted in FIG. 15, LP and 1VIP data can be recovered in the event of a power loss during any stage N through N+4 since the margin (space between distributions due to lack of overlap) between states S3 and S4 during these stages ensures that these states can be separated. Stated another way, since programming of the upper tail of S3 is slowed down, by the time the upper tail of S3 up-shifts (moves to the right as a result of the program pulses), the lower tail of S4 has already up-shifted. Thus, states S3 and S4 can be distinguished, ensuring that LP and MP data can be recovered during data recovery after a power loss.

In some implementations, a margin between neighboring states at the edges of QLC state groups (e.g., margins 1303, 1307, and 1311, FIG. 13) may be achieved by tightening the distribution of the data states (S3, S7, S11) that precede each read reference voltage ($V_{MP1}$, $V_{LP}$, $V_{MP2}$). In some implementations, a data state distribution may be tightened using an aggressive quick pass verification scheme.

An aggressive quick pass verification scheme uses an additional verify reference voltage during (or proximate to) the verification operation (706, FIG. 7) to tighten a particular distribution state. Referring to FIG. 15 as an example, the threshold voltages Vt of the memory cells for a particular state (e.g., S3) are compared to an additional verify reference voltage (e.g., Vvs3*). For memory cells having a threshold voltage Vt higher than the additional verify reference voltage, subsequent programming is partially inhibited (slowed down). By partially inhibiting subsequent programming for those memory cells, the upper tail of the distribution curve (e.g., the portion of the curve to the right of the additional verify reference voltage) falls more steeply, making room for a margin between a given distribution (e.g., S3) and the distribution to the right of the given distribution (e.g., S4). The additional verify reference voltage (e.g., Vvs3*) is higher than the primary verify reference voltage (e.g., Vvs3) for a given state, and lower than the primary verify reference voltage (e.g., Vvs4) for the next state.

In some implementations, programming may be slowed down for memory cells having a higher threshold voltage Vt than the additional verify reference voltage by applying an inhibiting voltage to the bit lines 425 (see FIG. 4F) associated with such memory cells.

As discussed above, if a memory cell is selected to be programmed, then the bit line 425 corresponding to the memory cell is grounded while the word line WL corresponding to the memory cell is subjected to program pulses of the program signal Vpgm (see FIG. 4F).

On the other hand, if a memory cell associated with an asserted word line is not selected to be programmed, then the bit line 425 corresponding to the memory cell is driven high (e.g., connected to supply voltage Vdd or Vcc) to prevent FN tunneling, thereby completely inhibiting programming.

Driving (biasing) the bit line associated with the memory cell to a level higher than ground but lower than Vdd only partially inhibits the programming of the memory cell, allowing the memory cell to be programmed, although at a slower rate. Such a bias level for the bit line (higher than ground but lower than Vdd) may be referred to as an inhibiting voltage because driving the bit line to such a level slightly inhibits (slows down), but does not completely inhibit (does not stop), the programming of memory cells associated with that bit line. In some implementations, the value of the inhibiting voltage may vary from 0<bit line voltage <(VDD-delta), where delta may vary depending on the intended slowness of a given programming operation.

Figure 16A:
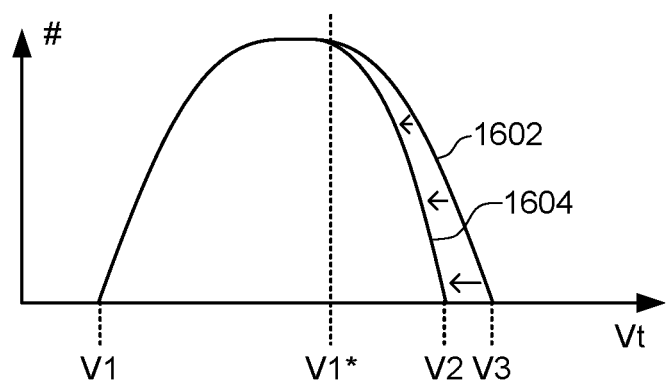
FIG. 16A depicts an example voltage distribution of a data state being subjected to tightening via an aggressive quick pass verification operation in accordance with some implementations.

FIG. 16A depicts an example voltage distribution of a data state being subjected to tightening via the aggressive quick pass verification operation described above. During the second (fine) programming phase (see FIG. 13), data states S3, S7, and S11 may be subjected to the aggressive quick pass verification operation to tighten their state distributions.

The aggressive quick pass scheme uses multiple verify levels, as described above. Referring to FIG. 16A, the first (primary) verify level V1 is used to determine whether all, or a minimum acceptable threshold, of the memory cells in the state distribution are adequately programmed for that state (operation 706, FIG. 7). The second (higher) verify level V1* is used to determine which memory cells in the state distribution should be subject to slower (slightly inhibited) programming for subsequent program pulses. When memory cells pass the higher verify level V1*, then a slightly higher bias is applied on the bit lines for those memory cells. The exact values for the higher verify reference voltage V1* and the lower tail voltage V2 may depend on various factors such as starting program voltage, verify voltage, cell marginalities, and so forth.

Without being tightened, the state distribution in FIG. 16A would extend to threshold voltage V3, which may cause the upper tail 1602 to overlap with the next state distribution. However, the tightening of the state distribution due to aggressive quick pass operations causes memory cells having a higher threshold voltage than V1* to be programmed at a slower rate, which provides for an upper tail 1604 that only extends to threshold voltage V2, thereby providing sufficient margin between the current state distribution and the next state distribution.

Figure 16B:
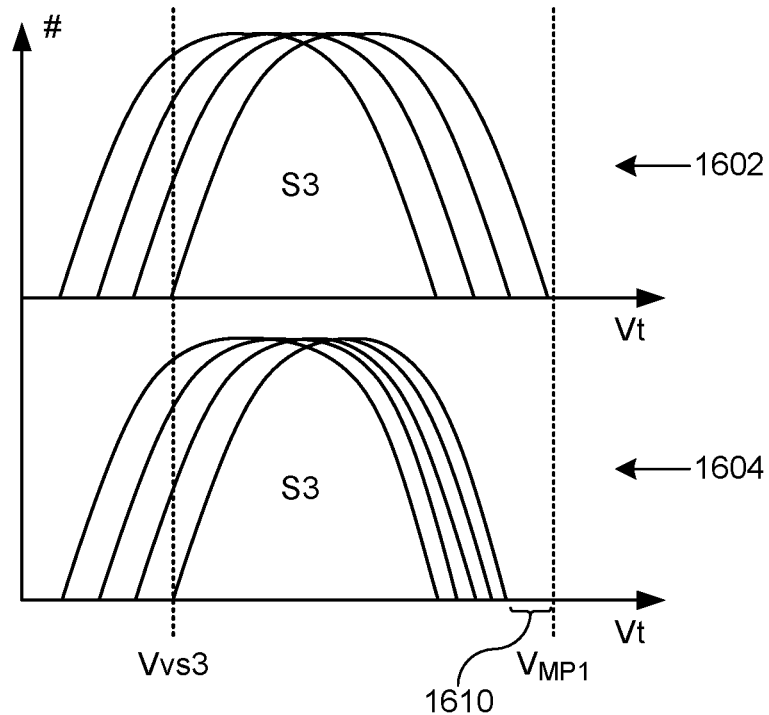
FIG. 16B depicts a plurality of successive stages of the second program phase for a state distribution in accordance with some implementations.

FIG. 16B depicts a plurality of successive stages (e.g., N through N+3) of the second program phase for a state distribution (e.g., S3).

In the top half of FIG. 16B, the state distributions are not subjected to tightening, thus having upper tails 1602 (as depicted in FIG. 16A). These state distribution curves correspond to those depicted in FIG. 14. There is no margin between the last distribution (the farthest to the right) and the MP read reference voltage $V_{MP1}$.

In the bottom half of FIG. 16B, the state distributions are subjected to tightening, thus having upper tails 1604 (as depicted in FIG. 16A). These state distribution curves correspond to those depicted in FIG. 15. As a result of the tightening, there is a margin 1610 between the last distribution (the farthest to the right) and the MP read reference voltage $V_{MP1}$.

As described above, the slightly higher bit line bias in the quick pass process is set such that it does not cut off the channel completely (does not completely inhibit or stop programming). Instead, the channel potential for such memory cells increases slightly enough to marginally inhibit the programming. This results in slowing down of the programming of S3, S7, and S11 cells that are at the upper tails (1604) of the selected states. This helps to tighten the state distributions and in turn provide sufficient margin for LP/MP reads during all stages of programming in the second (fine) programming phase.

This approach ensures that during any stage of the second (fine) programming phase, states S3, S7, and S11 do not overlap with the respective next states S4, S8, and S12, and provide sufficient margin. As such, the LP and MP data can be recovered even if there is a power loss at the fine stage of programming, without the need of storage of any page data in SLC.

Since the TP and UP data is not yet committed from the host, these two pages do not need data protection. The host writes LP and MP data first, then verifies the data is safe (safely written/committed to the storage medium 104) before proceeding to write upper page (UP) and top page (TP) data. There are various other ways to protect the UP and TP data in case it is required such as flushing the data using a hold up capacitor. However, the protection of UP and TP data in such a manner is outside the scope of this disclosure.

Figure 17:
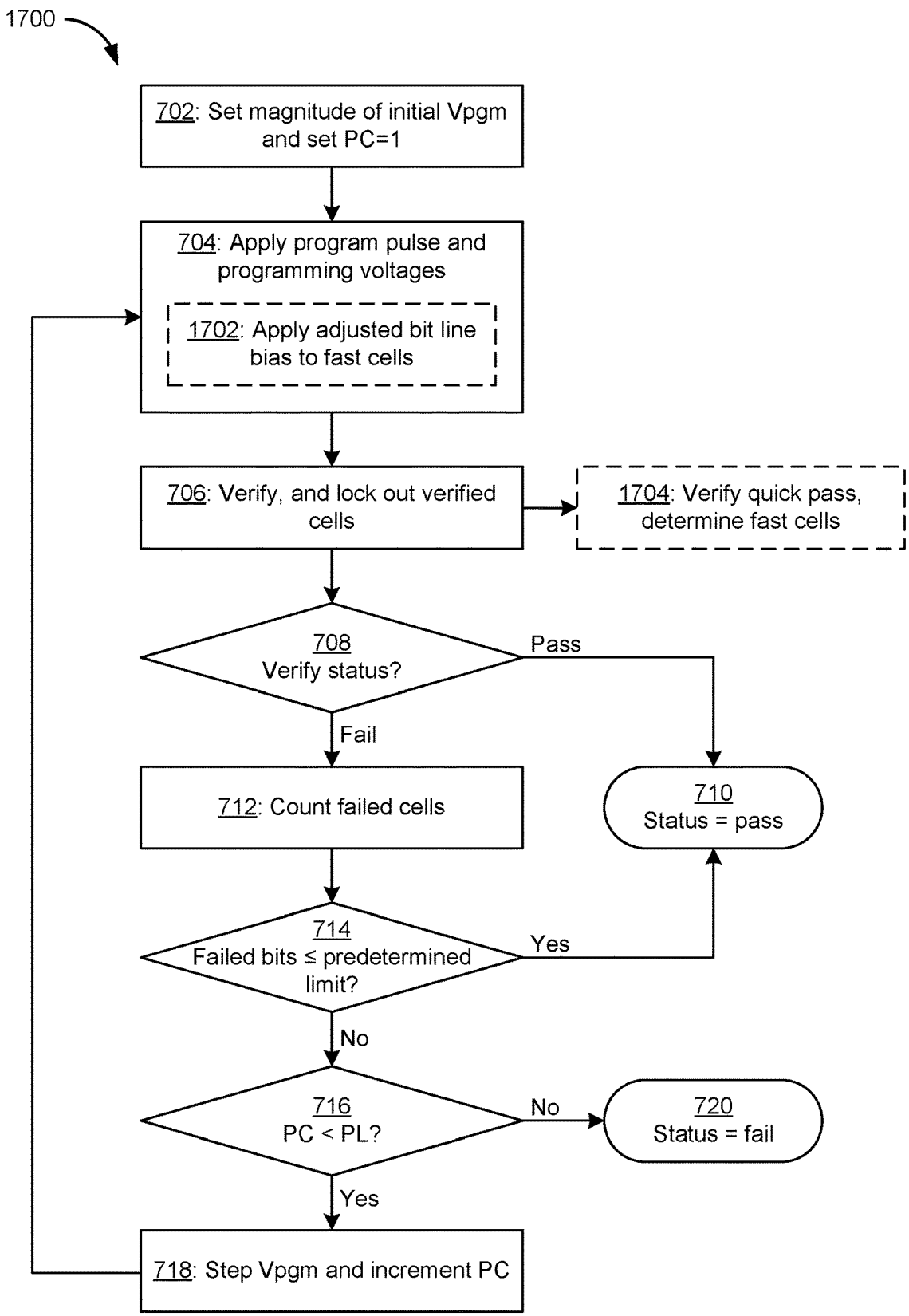
FIG. 17 is a flowchart depicting a process for performing programming operations on a plurality of memory cells in accordance with some implementations.

FIG. 17 is a flowchart depicting a process for performing programming operations on a plurality of memory cells in accordance with some implementations. Process 1700 is performed by the storage medium 104 in response to instructions, data and one or more addresses from the storage controller 102. Process 1700 can be used to implement each stage of a multiphase programming operation such as the multiphase examples in FIGS. 9A-13. Additionally, process 1700 can be used to program memory cells connected to the same word line.

Process 1700 is interchangeable with process 700, with the addition of two operations (1702 and 1704). As such, references made above to specific operations in process 700 (FIG. 7) also apply to the corresponding operations in process 1700 (FIG. 17). In general, operations in process 1700 that correspond to operations in process 700 are similarly numbered (e.g., operation 702 in process 1700 corresponds to operation 702 in process 700, and so forth).

Typically, the program voltage applied to the control gates (via a selected word line) during a program operation is applied as a series of program pulses (as described above with reference to FIGS. 8A-8B). Between programming pulses are a set of verify pulses to perform verification. In some implementations, the magnitude of the program pulses is increased with each successive pulse by a predetermined step size (as described above with reference to FIGS. 8A-8B).

In operation 702, the programming voltage (Vpgm) is initialized to the starting magnitude (e.g., ~12-16V or another suitable level) and a program counter PC maintained by the state machine is initialized at 1.

In operation 704, a program pulse of the program signal Vpgm is applied to the selected word line (the word line selected for programming). In some implementations, the group of memory cells being programmed concurrently are all connected to the same word line (the selected word line). The unselected word lines receive one or more boosting voltages (e.g., ~7-11 volts) to perform one or more boosting schemes.

As discussed above with reference to FIG. 4E, when a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476 (the programming voltage Vpgm). The threshold voltage (Vth) of the memory cell is increased in proportion to the amount of stored charge. The programming may be achieved through FN tunneling of the electrons into the charge trapping layer. For FN tunneling to occur, a high electric field is necessary across the charge trapping layer 473 and the channel 471. This high electric field is achieved by setting the word line of the memory cell to a high voltage Vpgm, and biasing the bit line of the memory cell to ground.

Thus, if a memory cell is selected to be programmed, then the bit line corresponding to the memory cell is grounded while the word line corresponding to the memory cell is subjected to program pulses of the program signal Vpgm.

On the other hand, if a memory cell associated with an asserted word line is not selected to be programmed, then the bit line corresponding to the memory cell is driven high (e.g., connected to Vdd) to prevent FN tunneling, thereby completely inhibiting programming.

Alternatively, if a memory cell associated with an asserted word line has been determined to be a fast cell and therefore require slower programming (operation 1704 below, also described above with reference to the aggressive quick pass operations depicted in FIGS. 13, 15, and 16A-16B), then the bit line corresponding to the memory cell is driven to a slightly elevated level (higher than ground but lower than Vdd), thereby slightly inhibiting programming (allowing the memory cell to be programmed, although at a slower rate) (operation 1702). Such memory cells are programmed in operation 704 while their bit lines are asserted at the slightly elevated level in accordance with operation 1702.

In operation 706, the memory cells programmed in operation 704 are subjected to a first verification using a set of first (or primary) verify reference voltages to perform one or more first verify operations. In some implementations, the first verification process is performed by testing whether the threshold voltages of the memory cells programmed in operation 704 have reached a first (or primary) verify reference voltage (e.g., Vvs3 in FIG. 15, or V1 in FIG. 16A). Memory cells that have reached the first (or primary) verify reference voltage are locked out from subsequent programming pulses applied during subsequent stages of the current programming phase.

In operation 1704, the memory cells programmed in operation 704 are subjected to a second verification using a set of second (or secondary) verify reference voltages to perform one or more second verify operations. In some implementations, the second verification process is performed by testing whether the threshold voltages of the memory cells programmed in operation 704 have reached a second (or secondary) verify reference voltage (e.g., Vvs3* in FIG. 15, or V1* in FIG. 16A). Memory cells that have reached the second (or secondary) verify reference voltage may be referred to as fast memory cells, since they are becoming programmed more quickly (located farther to the right in their respective state distributions) than those that have not reached the second verify reference voltage. The bit lines associated with the fast cells are asserted at the slightly elevated level (operation 1702) in subsequent programming pulses applied during subsequent stages of the current programming phase.

In some implementations, operations 1702 and 1704 are only performed during programming operations in a subset (less than all) of the distribution states. Specifically, only states that precede a read reference voltage for LP and MP data (e.g., states S3, S7, and S11) may be subject to aggressive quick pass operations (1704) and corresponding bit line adjustments (1702).

Operations 708-720 in process 1700 correspond to operations 708-720 in process 700 (FIG. 7), and are not further discussed for purposes of brevity.

By subjecting memory cells in a particular state distribution to the second verification operation 1704 (referred to herein as an aggressive quick pass operation) to determine which cells are fast cells, and slightly elevating the bit lines of the fast cells in operation 1702 (in subsequent programming stages) to slow the rate at which they are subsequently programmed, the state distribution for such memory cells may be tightened (as depicted in FIGS. 13, 15, and 16A-16B), thereby providing a margin (e.g., 1303, 1307, or 1311) between the particular state distribution (e.g., S3, S7, or S11) and the following state distribution (e.g., S4, S8, or S12). This margin ensures sufficient separation between adjacent state distributions, allowing LP and MP data to be recovered in the event of a power loss at any stage of the second (fine) programming phase without the need to temporarily store the LP and MP data in cache (or SLC) memory. As a result, this approach enables the omission of a buffer or cache to store the LP and MP data during second phase programming, which helps to simplify storage device design and frees device space for other productive uses such as storing user data or overprovisioning.

The aggressive quick pass operations and corresponding bit line adjustments described herein are not limited to applications involving multiphase programming. Instead, the aggressive quick pass operations and corresponding bit line adjustments described herein may be used in any application in which tightening a memory cell voltage distribution and/or providing or increasing a margin (space with no overlap) between adjacent memory cell voltage distributions is desired.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
a storage medium including a plurality of memory cells; and
control circuitry coupled to the storage medium, configured to program the plurality of memory cells using a multiphase programming scheme including a first programming phase and a second programming phase immediately following the first programming phase;
wherein the first programming phase includes programming a first set of voltage distributions of the plurality of memory cells by applying a first plurality of program pulses to word lines of the plurality of memory cells; and
wherein the second programming phase includes:
programming a second set of voltage distributions by applying a second plurality of program pulses to the word lines of the plurality of memory cells, wherein the second set of voltage distributions includes more voltage distributions than the first set of voltage distributions;
maintaining a margin of separation between two adjacent voltage distributions of the second set of voltage distributions after each of the second plurality of program pulses; and
allowing overlap between voltage distributions other than the two adjacent voltage distributions of the second set of voltage distributions after one or more of the second plurality of program pulses;
wherein a read reference voltage for lower page or middle page data associated with one or more of the second set of voltage distributions is in the margin of separation between the two adjacent voltage distributions.

2. The data storage system of claim 1, wherein:
a first voltage distribution of the two adjacent voltage distributions has a first width;
a second voltage distribution of the two adjacent voltage distributions has a second width; and
maintaining the margin of separation between the two adjacent voltage distributions includes decreasing the first width compared to the second width.

3. The data storage system of claim 2, wherein decreasing the first width compared to the second width includes partially inhibiting subsequent program pulses for a portion of memory cells in the first voltage distribution having threshold voltages higher than an inhibiting threshold.

4. The data storage system of claim 3, wherein:
the first voltage distribution is characterized by a first program verify target corresponding to a minimum threshold voltage for memory cells associated with the first voltage distribution;
the second voltage distribution is characterized by a second program verify target corresponding to a minimum threshold voltage for memory cells associated with the second voltage distribution; and
the inhibiting threshold is higher than the first program verify target and lower than the second program verify target.

5. The data storage system of claim 3, wherein partially inhibiting subsequent program pulses of the portion of memory cells in the first voltage distribution includes applying an inhibiting voltage signal to bit lines associated with the portion of memory cells.

6. The data storage system of claim 5, wherein:
the plurality of memory cells are configured to be completely inhibited from being programmed upon assertion of a supply voltage of the data storage system; and
the inhibiting voltage signal is greater than 0V and less than the supply voltage.

7. The data storage system of claim 1, wherein:
the first set of voltage distributions includes four multi-level cell (MLC) voltage distributions;
the second set of voltage distributions includes sixteen quad-level cell (QLC) voltage distributions; and
a read reference voltage for lower page or middle page data associated with one or more of the sixteen QLC voltage distributions is in the margin of separation between the two adjacent voltage distributions.

8. A method of programming a plurality of memory cells in a data storage system, the method comprising:
performing a first programming phase of a multiphase programming scheme, the first programming phase including programming a first set of voltage distributions of the plurality of memory cells by applying a first plurality of program pulses to word lines of the plurality of memory cells;
performing a second programming phase of the multiphase programming scheme, the second programming phase immediately following the first programming phase and including:
programming a second set of voltage distributions by applying a second plurality of program pulses to the word lines of the plurality of memory cells, wherein the second set of voltage distributions includes more voltage distributions than the first set of voltage distributions;
maintaining a margin of separation between two adjacent voltage distributions of the second set of voltage distributions after each of the second plurality of program pulses; and allowing overlap between voltage distributions other than the two adjacent voltage distributions of the second set of voltage distributions after one or more of the second plurality of program pulses;

wherein a read reference voltage for lower page or middle page data associated with one or more of the second set of voltage distributions is in the margin of separation between the two adjacent voltage distributions.

9. The method of claim 8, wherein:
a first voltage distribution of the two adjacent voltage distributions has a first width;
a second voltage distribution of the two adjacent voltage distributions has a second width; and
maintaining the margin of separation between the two adjacent voltage distributions includes decreasing the first width compared to the second width.

10. The method of claim 9, wherein decreasing the first width compared to the second width includes partially inhibiting subsequent program pulses for a portion of memory cells in the first voltage distribution having threshold voltages higher than an inhibiting threshold.

11. The method of claim 10, wherein:
the first voltage distribution is characterized by a first program verify target corresponding to a minimum threshold voltage for memory cells associated with the first voltage distribution;
the second voltage distribution is characterized by a second program verify target corresponding to a minimum threshold voltage for memory cells associated with the second voltage distribution; and
the inhibiting threshold is higher than the first program verify target and lower than the second program verify target.

12. The method of claim 10, wherein partially inhibiting subsequent program pulses of the portion of memory cells in the first voltage distribution includes applying an inhibiting voltage signal to bit lines associated with the portion of memory cells.

13. The method of claim 12, wherein:
the plurality of memory cells are configured to be completely inhibited from being programmed upon assertion of a supply voltage of the data storage system; and
the inhibiting voltage signal is greater than 0V and less than the supply voltage.

14. The method of claim 8, wherein:
the first set of voltage distributions includes four multi-level cell (MLC) voltage distributions;
the second set of voltage distributions includes sixteen quad-level cell (QLC) voltage distributions; and
a read reference voltage for lower page or middle page data associated with one or more of the sixteen QLC voltage distributions is in the margin of separation between the two adjacent voltage distributions.

15. A data storage system, comprising:
means for programming a plurality of memory cells of the data storage system according to a multiphase programming scheme including a first programming phase and a second programming phase immediately following the first programming phase;
wherein the first programming phase includes means for programming a first set of voltage distributions of the plurality of memory cells by applying a first plurality of program pulses to word lines of the plurality of memory cells; and wherein the second programming phase includes:
means for programming a second set of voltage distributions by applying a second plurality of program pulses to the word lines of the plurality of memory cells, wherein the second set of voltage distributions includes more voltage distributions than the first set of voltage distributions;
means for maintaining a margin of separation between two adjacent voltage distributions of the second set of voltage distributions after each of the second plurality of program pulses; and
allowing overlap between voltage distributions other than the two adjacent voltage distributions of the second set of voltage distributions after one or more of the second plurality of program pulses;
wherein a read reference voltage for lower page or middle page data associated with one or more of the second set of voltage distributions is in the margin of separation between the two adjacent voltage distributions.

16. The data storage system of claim 15, wherein:
a first voltage distribution of the two adjacent voltage distributions has a first width;
a second voltage distribution of the two adjacent voltage distributions has a second width; and
the means for maintaining the margin of separation between the two adjacent voltage distributions include means for decreasing the first width compared to the second width.

17. The data storage system of claim 16, wherein the means for decreasing the first width compared to the second width include means for partially inhibiting subsequent program pulses for a portion of memory cells in the first voltage distribution having threshold voltages higher than an inhibiting threshold.

18. The data storage system of claim 17, wherein:
the first voltage distribution is characterized by a first program verify target corresponding to a minimum threshold voltage for memory cells associated with the first voltage distribution;
the second voltage distribution is characterized by a second program verify target corresponding to a minimum threshold voltage for memory cells associated with the second voltage distribution; and
the inhibiting threshold is higher than the first program verify target and lower than the second program verify target.

19. The data storage system of claim 17, wherein:
the means for partially inhibiting subsequent program pulses of the portion of memory cells in the first voltage distribution include means for applying an inhibiting voltage signal to bit lines associated with the portion of memory cells;
the plurality of memory cells are configured to be completely inhibited from being programmed upon assertion of a supply voltage of the data storage system; and
the inhibiting voltage signal is greater than 0V and less than the supply voltage.

20. The data storage system of claim 15, wherein:
the first set of voltage distributions includes four multi-level cell (MLC) voltage distributions;
the second set of voltage distributions includes sixteen quad-level cell (QLC) voltage distributions; and
a read reference voltage for lower page or middle page data associated with one or more of the sixteen QLC voltage distributions is in the margin of separation between the two adjacent voltage distributions.

* * * * *